(12) United States Patent
Muto

(10) Patent No.: US 10,608,694 B2
(45) Date of Patent: Mar. 31, 2020

(54) HIGH-FREQUENCY MODULE, TRANSMISSION-RECEPTION MODULE, AND COMMUNICATION APPARATUS

(71) Applicant: Murata Manufacturing Co., Ltd., Kyoto (JP)

(72) Inventor: Hideki Muto, Kyoto (JP)

(73) Assignee: MURATA MANUFACTURING CO., LTD., Kyoto (JP)

(*) Notice: Subject to any disclaimer, the term of this patent is extended or adjusted under 35 U.S.C. 154(b) by 0 days.

(21) Appl. No.: 16/451,522

(22) Filed: Jun. 25, 2019

(65) Prior Publication Data

US 2019/0312608 A1    Oct. 10, 2019

Related U.S. Application Data

(63) Continuation of application No. PCT/JP2017/046267, filed on Dec. 22, 2017.

(30) Foreign Application Priority Data

Dec. 27, 2016   (JP) .................. 2016-254344

(51) Int. Cl.
*H04B 1/38*   (2015.01)
*H04B 1/525*  (2015.01)
(Continued)

(52) U.S. Cl.
CPC ............. *H04B 1/525* (2013.01); *H03F 3/189* (2013.01); *H03F 7/38* (2013.01); *H03F 2200/451* (2013.01); *H03H 2007/386* (2013.01)

(58) Field of Classification Search
CPC   H04B 1/525; H04B 1/40; H03F 3/189; H03F 2200/451; H03H 7/38; H03H 2007/386
See application file for complete search history.

(56) References Cited

U.S. PATENT DOCUMENTS 6,472,952 B1   10/2002   Sakai et al.
7,053,717 B2 *  5/2006   Gresham .................. H03F 1/26
                                                330/150
(Continued)

FOREIGN PATENT DOCUMENTS

JP    2006-333390 A    12/2006
JP    2014-207517 A    10/2014
(Continued)

OTHER PUBLICATIONS

International Search Report for International Application No. PCT/JP2017/046267 dated Mar. 20, 2018.

(Continued)

*Primary Examiner* — Tuan Pham
(74) *Attorney, Agent, or Firm* — Pearne & Gordon LLP

(57) ABSTRACT

A high-frequency module (20) includes a reception-side filter (21) that uses a first frequency band as a pass band and a second frequency band as an attenuation band, an LNA (23), and a matching circuit (22) disposed between the reception-side filter (21) and the LNA (23). In a Smith chart, the matching circuit (22) makes an interval between impedance in the second frequency band of the reception-side filter (21) and a second gain circle center point indicating impedance at which gain in the second frequency band of the LNA (23) is maximized greater than an interval between impedance in the first frequency band of the reception-side filter (21) and a first gain circle center point indicating impedance at which gain in the first frequency band of the LNA (23) is maximized.

11 Claims, 11 Drawing Sheets

(51) Int. Cl.
 H03F 3/189 (2006.01)
 H03H 7/38 (2006.01)

(56) References Cited

U.S. PATENT DOCUMENTS

| | | |
|---|---|---|
| 2006/0270380 A1 | 11/2006 | Matsushima et al. |
| 2010/0203847 A1* | 8/2010 | Gorbachov ............. H03H 7/38 455/84 |
| 2013/0278333 A1* | 10/2013 | Corral .................... H03F 3/602 330/144 |
| 2014/0308906 A1 | 10/2014 | Saji et al. |
| 2016/0352494 A1 | 12/2016 | Uejima et al. |
| 2017/0346452 A1 | 11/2017 | Wada et al. |
| 2019/0052241 A1 | 2/2019 | Muto |

FOREIGN PATENT DOCUMENTS

| | | |
|---|---|---|
| JP | 2018-026795 A | 2/2018 |
| WO | 00/28673 A1 | 5/2000 |
| WO | 2015/125638 A1 | 8/2015 |
| WO | 2016/133028 A1 | 8/2016 |

OTHER PUBLICATIONS

Written Opinion for International Application No. PCT/JP2017/046267 dated Mar. 20, 2018.

* cited by examiner

FIG. 2
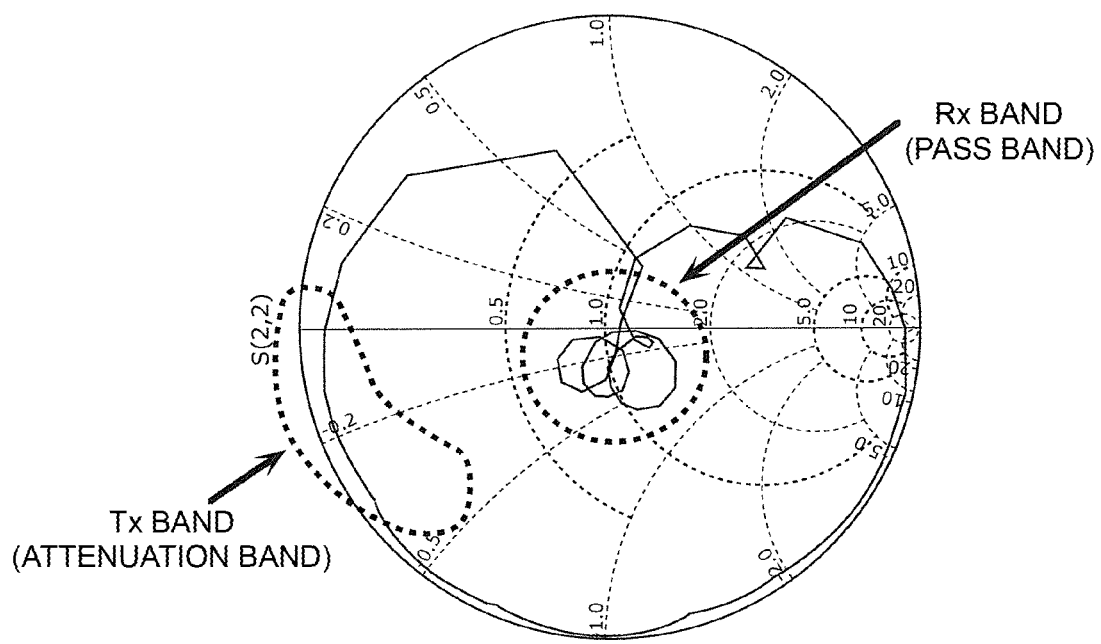
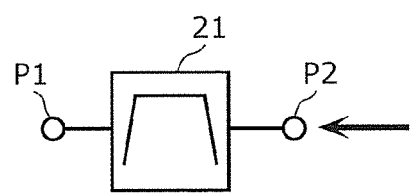

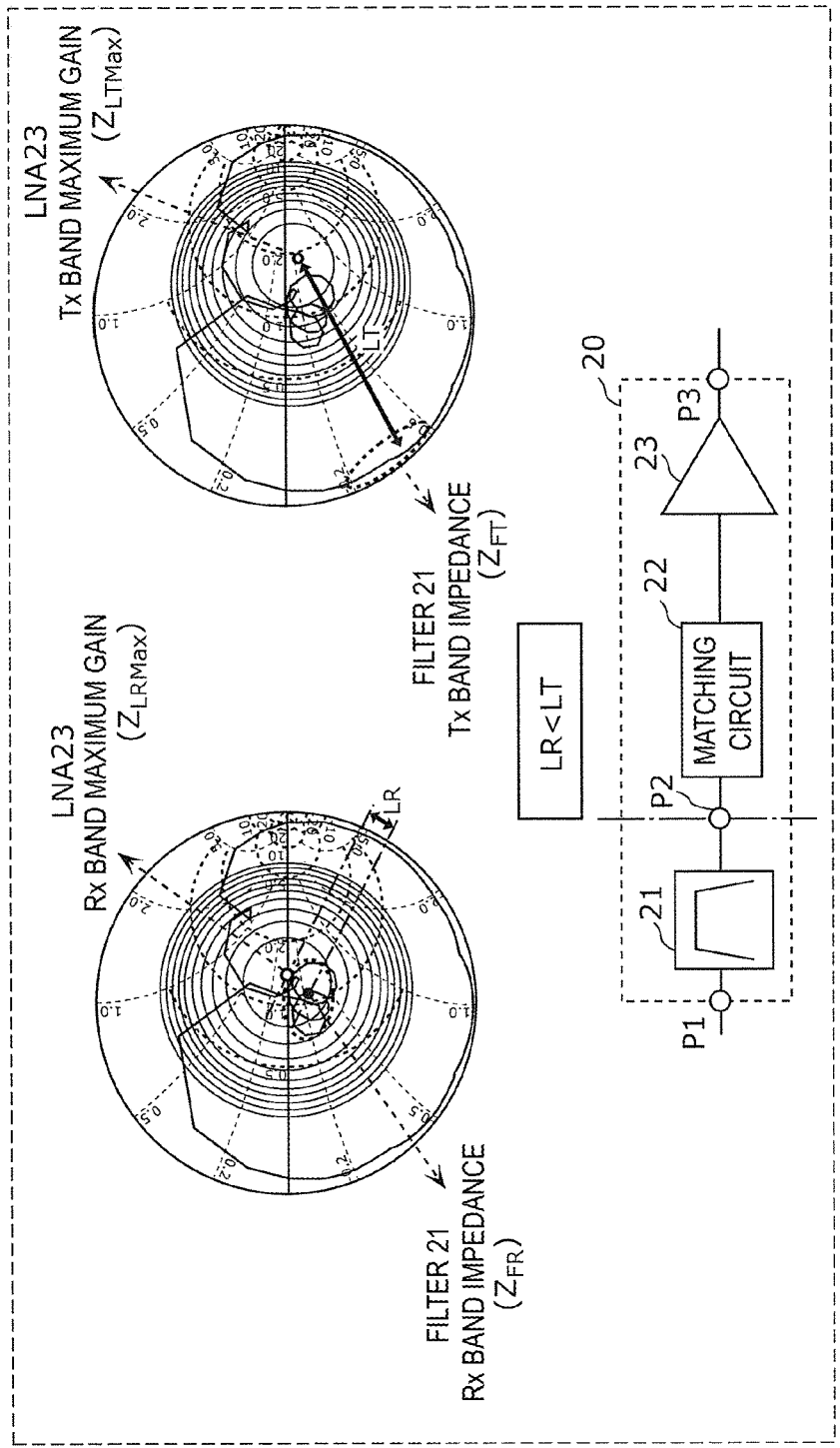

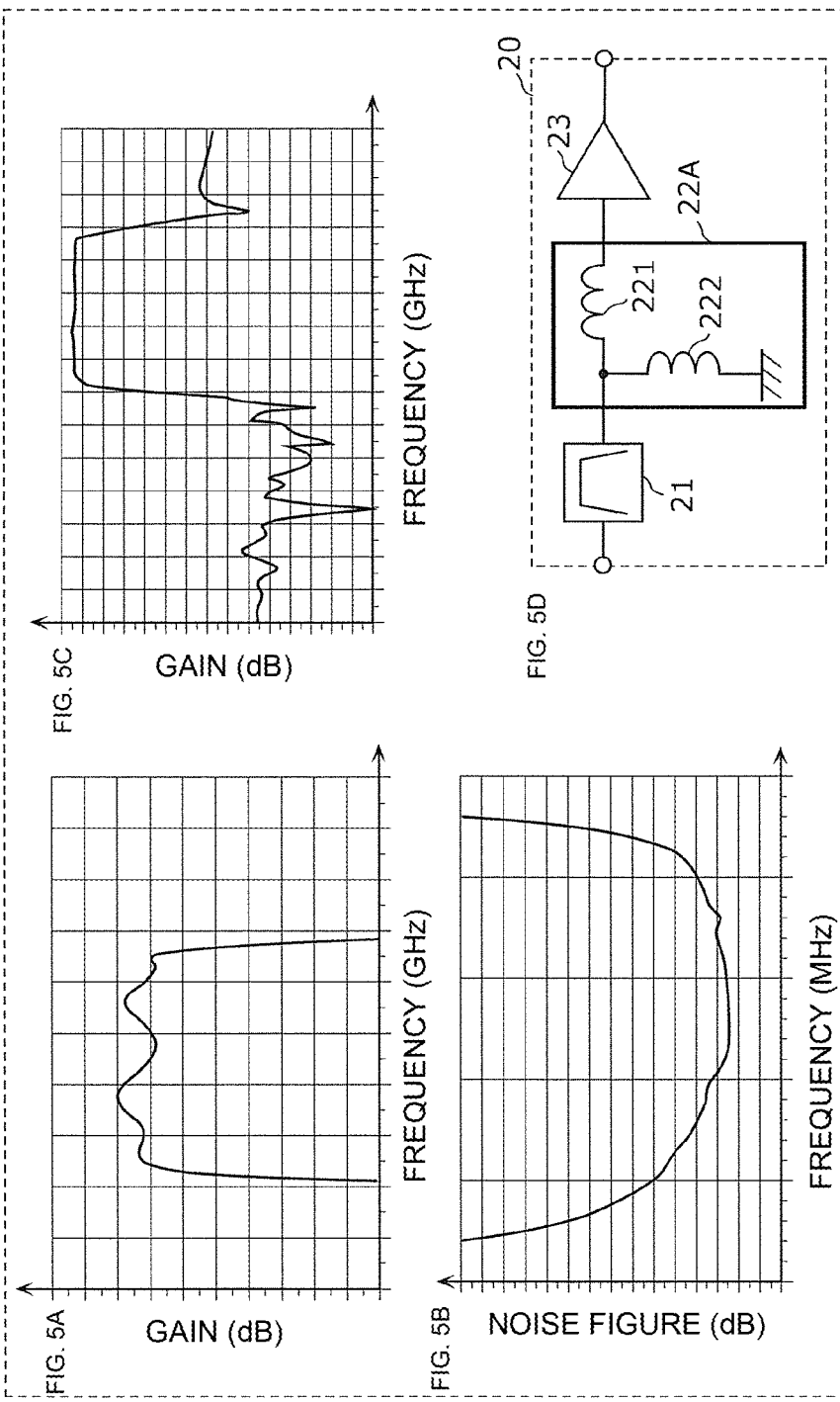

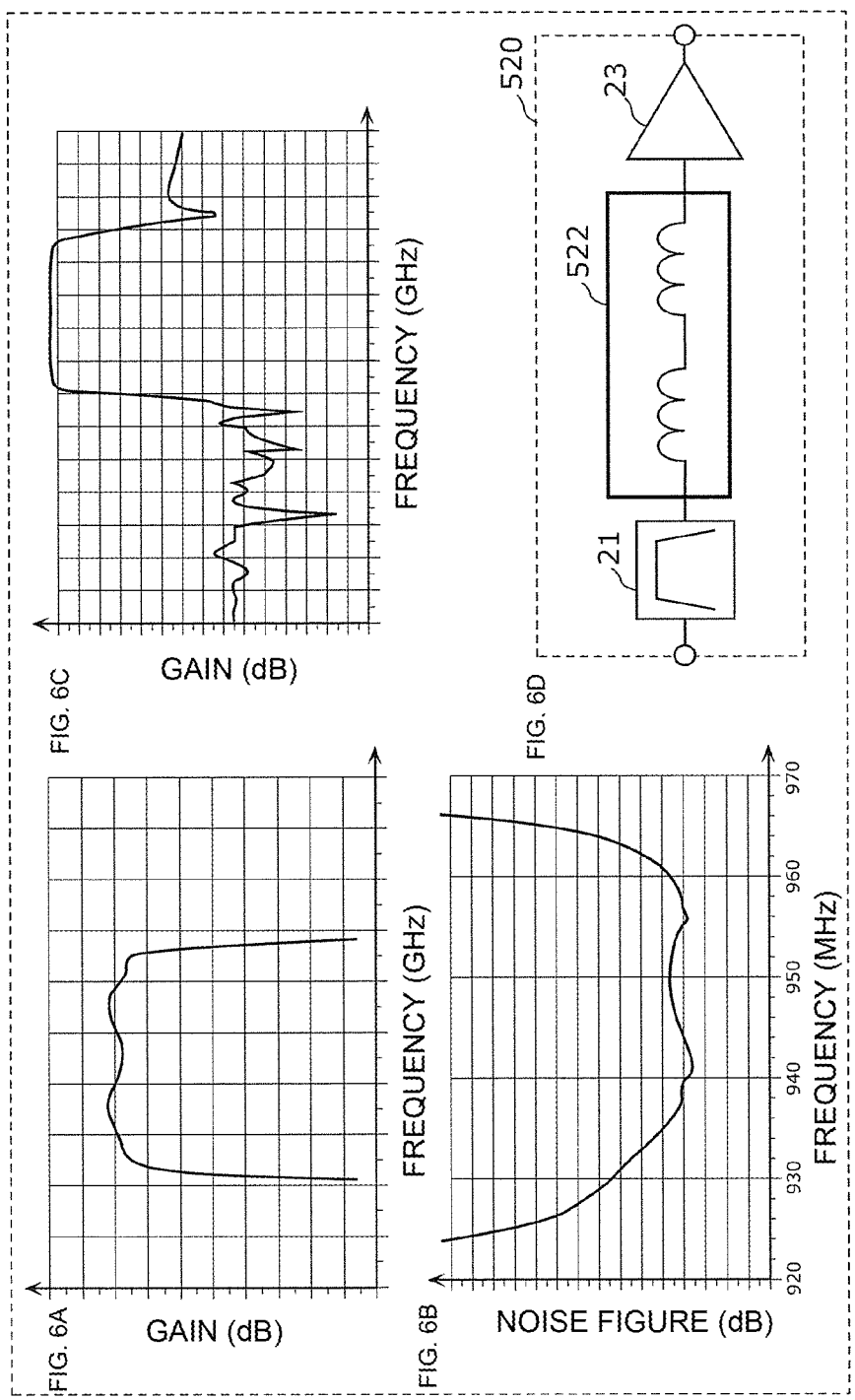

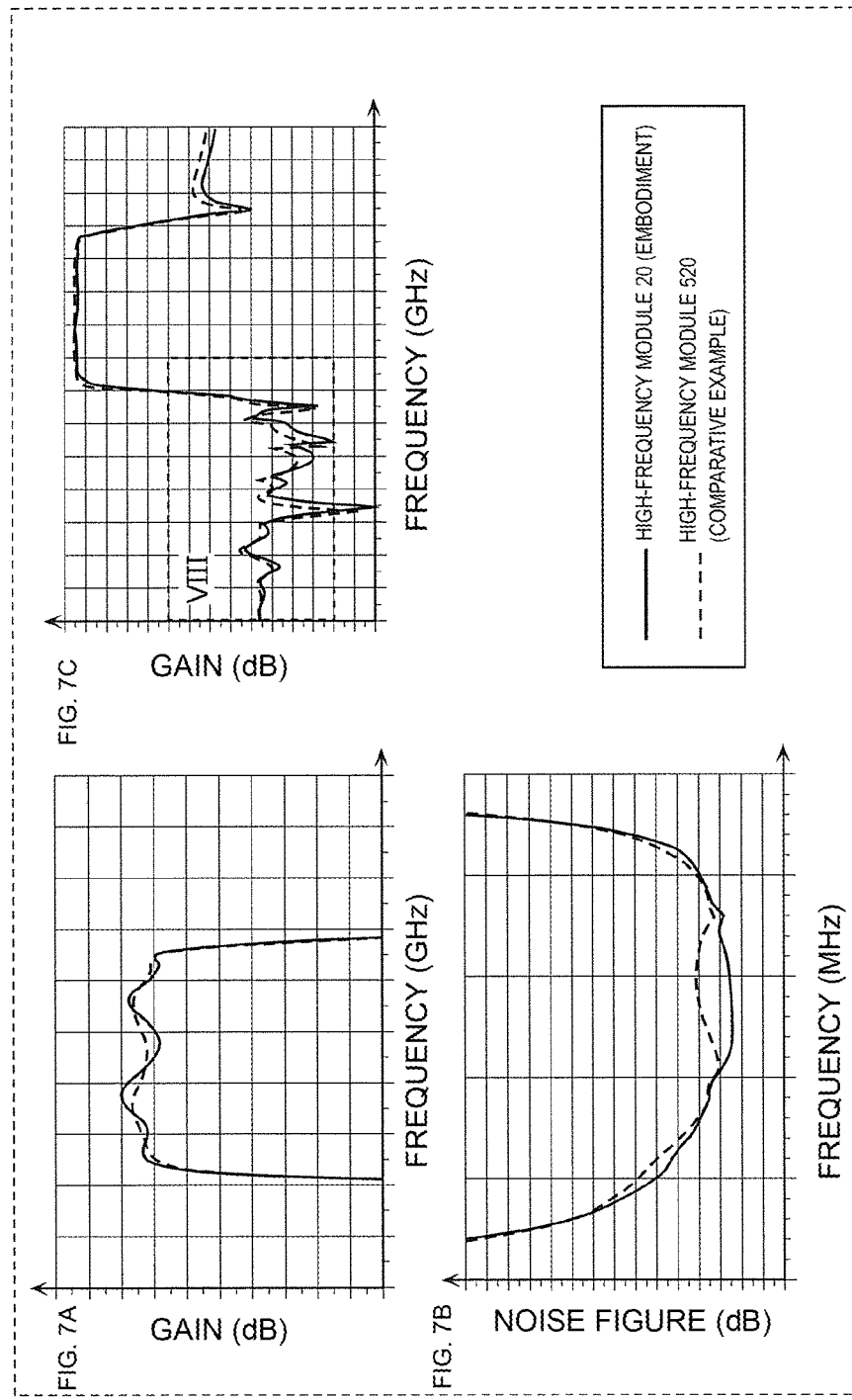

HIGH-FREQUENCY MODULE, TRANSMISSION-RECEPTION MODULE, AND COMMUNICATION APPARATUS

This is a continuation of International Application No. PCT/JP2017/046267 filed on Dec. 22, 2017 which claims priority from Japanese Patent Application No. 2016-254344 filed on Dec. 27, 2016. The contents of these applications are incorporated herein by reference in their entireties.

BACKGROUND OF THE DISCLOSURE

Field of the Disclosure

The present disclosure relates to a high-frequency module including a low noise amplifier, a transmission-reception module, and a communication apparatus.

Description of the Related Art

Circuit configurations that suppress the isolation between signal paths on which the signals in different frequency bands are propagated and the degradation of reception sensitivity have been proposed in recent years in order to reduce the sizes of high-frequency front-end modules installed in mobile terminals or the likes or to support the multiband operations of the high-frequency front-end modules.

Patent Document 1 discloses a circuit in which a phase shifter is disposed between a reception filter and a low noise amplifier. Reducing the disturbing signals to be inputted into the low noise amplifier by shifting the impedance in a transmission band of the reception filter and the input impedance of the low noise amplifier with the phase shifter to suppress an occurrence of distortion is disclosed in Patent Document 1.

Patent Document 1: International Publication No. 00/028673

BRIEF SUMMARY OF THE DISCLOSURE

However, in the circuit disclosed in Patent Document 1, the disturbing signals are inputted into the low noise amplifier to be amplified although the disturbing signals are reduced. Distortions, such as intermodulation distortion (IMD) and harmonics, occur or gains are reduced in circuits including a mixer and a radio-frequency (RF) signal processing circuit (radio-frequency integrated circuit (RFIC)), which are disposed downstream of the low noise amplifier, owing to the amplified disturbing signals and input power including signals in a reception band (a pass band). This degrades the reception sensitivity in a reception circuit including the low noise amplifier.

In order to resolve the above problems, it is an object of the present disclosure to provide a high-frequency module, a transmission-reception module, and a communication apparatus in which the degradation of the reception sensitivity in the reception circuit including the low noise amplifier is suppressed.

In order to achieve the above object, a high-frequency module according to an aspect of the present disclosure includes a first filter that uses a first frequency band as a pass band and a second frequency band as an attenuation band; a low noise amplifier that amplifies a high-frequency signal transmitted through the first filter; and an impedance matching circuit that is disposed between the first filter and the low noise amplifier. In a Smith chart, the impedance matching circuit makes an interval between impedance in the second frequency band when the first filter is viewed from an output end of the first filter and a second gain circle center point indicating impedance at which gain in the second frequency band of the low noise amplifier at the output end is maximized greater than an interval between impedance in the first frequency band when the first filter is viewed from the output end of the first filter and a first gain circle center point indicating impedance at which gain in the first frequency band of the low noise amplifier at the output end is maximized.

With the above configuration, the impedance (the second gain circle center point) at the maximum gain in the attenuation band of the low noise amplifier is capable of being relatively apart from the impedance in the attenuation band of the first filter by varying the topology of the impedance matching circuit provided upstream of the low noise amplifier. Accordingly, since gain mismatch is caused between the low noise amplifier and the first filter in the attenuation band, the signal component in the attenuation band, which can be supplied to the downstream of the low noise amplifier, is capable of being attenuated at the upstream of the low noise amplifier by an amount greater than or equal to the attenuation characteristic defined in the first filter to suppress the degradation of the reception sensitivity in the first frequency band. In addition, since it is not necessary to add a new matching circuit at the downstream of the first filter and the downstream of the low noise amplifier in the attenuation of the signal component in the attenuation band, it is possible to suppress the degradation of a noise figure of the high-frequency module.

When four areas resulting from division along a vertical line and a horizontal line through a characteristic impedance (a center point) are defined in the Smith chart, the impedance in the second frequency band when the first filter is viewed from the output end of the first filter and the second gain circle center point may be positioned in different areas.

With the above configuration, since further gain mismatch is caused between the low noise amplifier and the first filter in the attenuation band, the signal component in the attenuation band, which can be supplied to the downstream of the low noise amplifier, is capable of being further attenuated at the upstream of the low noise amplifier.

When the second frequency band is at a low frequency side of the first frequency band, the impedance matching circuit may compose a high pass circuit.

With the above configuration, the impedance matching circuit has both (1) a gain mismatch function between the low noise amplifier and the first filter in the attenuation band and (2) a high pass function to attenuate the signal component in the attenuation band and transmit the signal component in the pass band. Accordingly, the impedance matching circuit is capable of effectively attenuating the signal component in the attenuation band, which can be supplied to the downstream of the low noise amplifier, at the upstream of the low noise amplifier.

When the second frequency band is at a high frequency side of the first frequency band, the impedance matching circuit may compose a low pass circuit.

With the above configuration, the impedance matching circuit has both (1) the gain mismatch function between the low noise amplifier and the first filter in the attenuation band and (2) a low pass function to transmit the signal component in the pass band and attenuate the signal component in the attenuation band. Accordingly, the impedance matching circuit is capable of effectively attenuating the signal component in the attenuation band, which can be supplied to the downstream of the low noise amplifier, at the upstream of the low noise amplifier.

The high-frequency module may further include a phase shifter that is disposed between the first filter and the low noise amplifier.

With the above configuration, since the phase of the impedance in the attenuation band of the first filter is capable of being shifted, the positional relationship between the impedance (the second gain circle center point) at the maximum gain in the attenuation band of the low noise amplifier and the impedance in the attenuation band of the first filter is capable of being easily adjusted with high accuracy. As a result, further gain mismatch is caused between the low noise amplifier and the first filter, compared with the case in which the phase shifter is not provided.

The high-frequency module may further include a second filter that uses a third frequency band as the pass band and a fourth frequency band as the attenuation band and a switch that is disposed between the first filter and the second filter and the low noise amplifier and that switches between a conducting state and a non-conducting state between the first filter and the low noise amplifier and switches between the conducting state and the non-conducting state between the second filter and the low noise amplifier. The first frequency band may be at a high frequency side of the second frequency band and the third frequency band may be at a high frequency side of the fourth frequency band. The impedance matching circuit may be connected between the switch and the low noise amplifier. A circuit that performs impedance matching between the first filter and the low noise amplifier may not be disposed between the first filter and the switch and a circuit that performs the impedance matching between the second filter and the low noise amplifier may not be disposed between the second filter and the switch. In a Smith chart, the impedance matching circuit may make the interval between the impedance in the second frequency band when the first filter is viewed from the output end of the first filter and the second gain circle center point greater than the interval between the impedance in the first frequency band when the first filter is viewed from the output end of the first filter and the first gain circle center point, and the impedance matching circuit may make an interval between impedance in the fourth frequency band when the second filter is viewed from an output end of the second filter and a fourth gain circle center point indicating impedance at which gain in the fourth frequency band of the low noise amplifier at the output end is maximized greater than an interval between impedance in the third frequency band when the second filter is viewed from the output end of the second filter and a third gain circle center point indicating impedance at which gain in the third frequency band of the low noise amplifier at the output end is maximized.

The high-frequency module may further include a second filter that uses a third frequency band as the pass band and a fourth frequency band as the attenuation band and a switch that is disposed between the first filter and the second filter and the low noise amplifier and that switches between a conducting state and a non-conducting state between the first filter and the low noise amplifier and switches between the conducting state and the non-conducting state between the second filter and the low noise amplifier. The first frequency band may be at a low frequency side of the second frequency band and the third frequency band may be at a low frequency side of the fourth frequency band. The impedance matching circuit may be connected between the switch and the low noise amplifier. A circuit that performs impedance matching between the first filter and the low noise amplifier may not be disposed between the first filter and the switch and a circuit that performs the impedance matching between the second filter and the low noise amplifier may not be disposed between the second filter and the switch. In a Smith chart, the impedance matching circuit may make the interval between the impedance in the second frequency band when the first filter is viewed from the output end of the first filter and the second gain circle center point greater than the interval between the impedance in the first frequency band when the first filter is viewed from the output end of the first filter and the first gain circle center point, and the impedance matching circuit may make an interval between impedance in the fourth frequency band when the second filter is viewed from an output end of the second filter and a fourth gain circle center point indicating impedance at which gain in the fourth frequency band of the low noise amplifier at the output end is maximized greater than an interval between impedance in the third frequency band when the second filter is viewed from the output end of the second filter and a third gain circle center point indicating impedance at which gain in the third frequency band of the low noise amplifier at the output end is maximized.

With the above configuration, since the first filter and the second filter have the same high-low relationship of the frequencies of the pass band and the attenuation band, the impedance matching circuit is capable of being composed with the same topology. Accordingly, the impedances (the second gain circle center point and the fourth gain circle center point) at the maximum gains in the second frequency band and the fourth frequency band of the low noise amplifier are capable of being relatively apart from the impedances in the attenuation bands of the first filter and the second filter only with the common impedance matching circuit disposed between the switch and the low noise amplifier. In other words, since the gain mismatch is caused between the low noise amplifier and the first filter and the second filter in the above attenuation bands, the signal components in the attenuation bands, which can be supplied to the downstream of the low noise amplifier, are capable of being attenuated by an amount greater than or equal to the attenuation characteristics defined in the first filter and the second filter. Accordingly, it is possible to suppress the degradation of the reception sensitivity in the first frequency band and the third frequency band. In addition, since it is not necessary to add a new matching circuit at the upstream of the switch, the downstream of the first filter and the second filter, and the downstream of the low noise amplifier in the attenuation of the above signal components, it is possible to suppress the degradation of the noise figure while reducing the size of the high-frequency module.

The high-frequency module may further include a second filter that uses a third frequency band as the pass band and a fourth frequency band as the attenuation band and a switch that is disposed between the first filter and the second filter and the low noise amplifier and that switches between a conducting state and a non-conducting state between the first filter and the low noise amplifier and switches between the conducting state and a non-conducting state between the second filter and the low noise amplifier. The first frequency band may be at a high frequency side of the second frequency band and the third frequency band may be at a low frequency side of the fourth frequency band. The impedance matching circuit may include at least one of a first impedance matching circuit disposed between the first filter and the switch and a second impedance matching circuit disposed between the second filter and the switch. In a Smith chart, the impedance matching circuit may make the interval between the impedance in the second frequency band when the first filter is viewed from the output end of the first filter and the second gain circle center point greater than the interval between the impedance in the first frequency band when the first filter is viewed from the output end of the first filter and the first gain circle center point, and the impedance matching circuit may make an interval between impedance in the fourth frequency band when the second filter is viewed from an output end of the second filter and a fourth gain circle center point indicating impedance at which gain in the fourth frequency band of the low noise amplifier at the output end is maximized greater than an interval between impedance in the third frequency band when the second filter is viewed from the output end of the second filter and a third gain circle center point indicating impedance at which gain in the third frequency band of the low noise amplifier at the output end is maximized.

The high-frequency module may further include a second filter that uses a third frequency band as the pass band and a fourth frequency band as the attenuation band and a switch that is disposed between the first filter and the second filter and the low noise amplifier and that switches between a conducting state and a non-conducting state between the first filter and the low noise amplifier and switches between the conducting state and a non-conducting state between the second filter and the low noise amplifier. The first frequency band may be at a low frequency side of the second frequency band and the third frequency band may be at a high frequency side of the fourth frequency band. The impedance matching circuit may include at least one of a first impedance matching circuit disposed between the first filter and the switch and a second impedance matching circuit disposed between the second filter and the switch. In a Smith chart, the impedance matching circuit may make the interval between the impedance in the second frequency band when the first filter is viewed from the output end of the first filter and the second gain circle center point greater than the interval between the impedance in the first frequency band when the first filter is viewed from the output end of the first filter and the first gain circle center point, and the impedance matching circuit may make an interval between impedance in the fourth frequency band when the second filter is viewed from an output end of the second filter and a fourth gain circle center point indicating impedance at which gain in the fourth frequency band of the low noise amplifier at the output end is maximized greater than an interval between impedance in the third frequency band when the second filter is viewed from the output end of the second filter and a third gain circle center point indicating impedance at which gain in the third frequency band of the low noise amplifier at the output end is maximized.

With the above configuration, since the first filter and the second filter have different high-low relationships of the frequencies of the pass band and the attenuation band, it may be necessary to compose the impedance matching circuits with different topologies. Accordingly, the common impedance element is disposed between the switch and the low noise amplifier and the impedance elements that are not common are disposed between the first filter and the switch (the first impedance matching circuit) and between the second filter and the switch (the second impedance matching circuit), if needed. Accordingly, the impedances (the second gain circle center point and the fourth gain circle center point) at the maximum gains in the second frequency band and the fourth frequency band of the low noise amplifier are capable of being relatively apart from the impedances in the attenuation bands of the first filter and the second filter. In other words, since the gain mismatch is caused between the low noise amplifier and the first filter and the second filter in the above attenuation bands, the signal components in the attenuation bands, which can be supplied to the downstream of the low noise amplifier, are capable of being attenuated at the upstream of the low noise amplifier by an amount greater than or equal to the attenuation characteristics defined in the first filter and the second filter. Accordingly, it is possible to suppress the degradation of the reception sensitivity in the first frequency band and the third frequency band. In addition, since it is not necessary to add a new matching circuit at the downstream of the low noise amplifier in the attenuation of the above signal components, it is possible to suppress the degradation of the noise figure of the high-frequency module.

A transmission-reception module according to an aspect of the present disclosure includes the high-frequency module, which has a common terminal; a third filter that is connected to the first filter with the common terminal and that uses the second frequency band as the pass band and the first frequency band as the attenuation band; and a power amplifier that supplies a high-frequency signal that is amplified to the third filter.

With the above configuration, since the gain mismatch is caused between the low noise amplifier and the first filter in the transmission band of the second filter (the attenuation band of the first filter), the transmission signal component, which can be supplied to the downstream of the low noise amplifier, is capable of being attenuated at the upstream of the low noise amplifier by an amount greater than or equal to the attenuation characteristic defined in the first filter. Accordingly, since the high-frequency signal in the second frequency band, which is amplified in the power amplifier and is transmitted through the second filter, is strongly inputted into the low noise amplifier through the first filter, it is possible to suppress an occurrence of distortion in amplification characteristics of the low noise amplifier and a reduction in gain, thus suppressing the degradation of the reception sensitivity in the reception circuit including the low noise amplifier.

A communication apparatus according to an aspect of the present disclosure includes the high-frequency module and an RF signal processing circuit that processes a high-frequency signal supplied from the high-frequency module.

With the above configuration, the signal component in the attenuation band, which can be supplied to the downstream of the low noise amplifier, is capable of being attenuated at the upstream of the low noise amplifier by an amount greater than or equal to the attenuation characteristic defined in the first filter to provide the communication apparatus in which the degradation of the reception sensitivity in the reception circuit including the low noise amplifier is suppressed.

According to the present disclosure, it is possible to provide the high-frequency module, the transmission-reception module, and the communication apparatus in which the degradation of the reception sensitivity is suppressed.

BRIEF DESCRIPTION OF THE SEVERAL VIEWS OF THE DRAWINGS

FIG. 2 is a Smith chart representing impedance of a reception-side filter in a high-frequency module according to the first embodiment.

FIG. 3 includes Smith charts indicating the positional relationship between the impedance of the reception-side filter and maximum gain of a low noise amplifier in the high-frequency module according to the first embodiment.

FIGS. 5A, 5B, 5C and 5D include graphs indicating gains and a noise figure of the high-frequency module according to the first example.

FIGS. 6A, 6B, 6C and 6D include graphs indicating the gains and the noise figure of a high-frequency module according to a comparative example.

FIGS. 7A, 7B and 7C include graphs resulting from the comparison between the gain and the noise figure of the high-frequency module according to the first example and those of the high-frequency module according to the comparative example.

DETAILED DESCRIPTION OF THE DISCLOSURE

Figure 1:
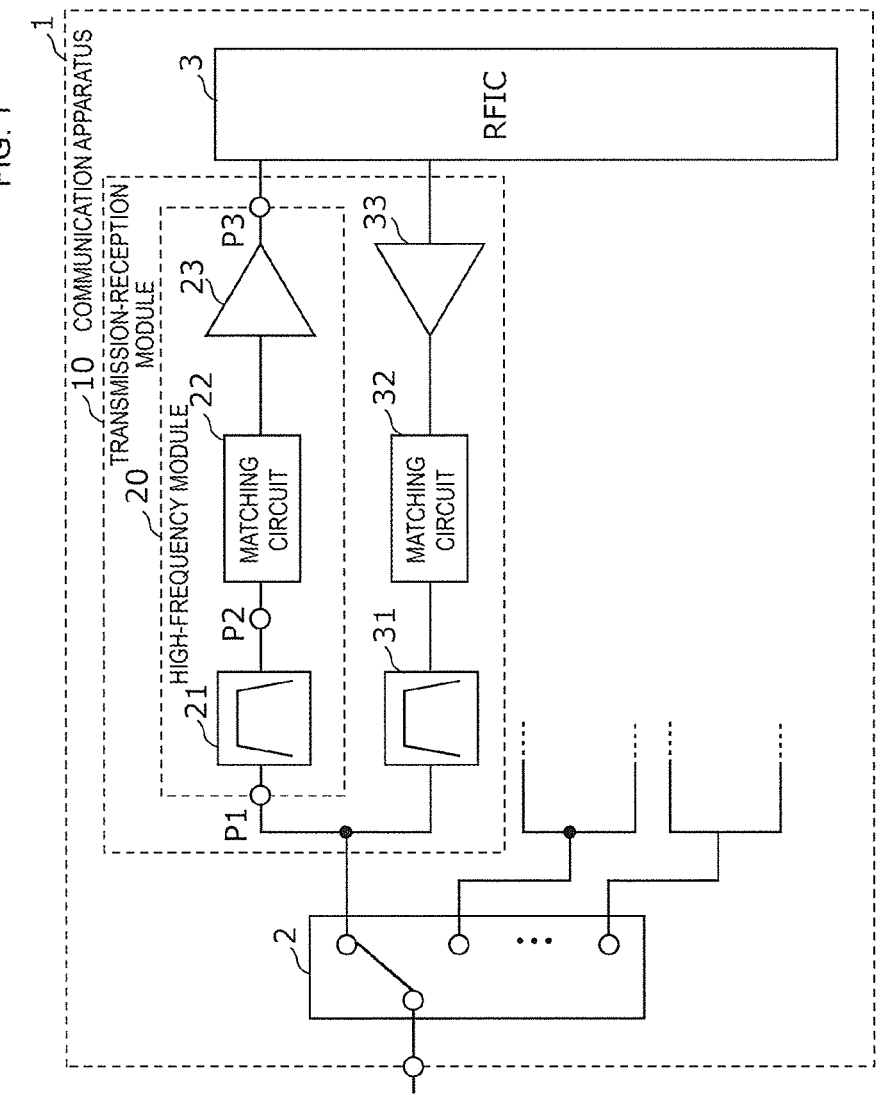
FIG. 1 is a diagram illustrating a circuit configuration of a communication apparatus according to a first embodiment.

High-frequency modules, a transmission-reception module, and a communication apparatus according to embodiments of the present disclosure will herein be described in detail using examples with reference to the drawings. The embodiments described below indicate comprehensive or specific examples. Numerical values, shapes, materials, components, the arrangement of the components, the connection mode of the components, and so on, which are indicated in the embodiments described below, are only examples and are not intended to limit the present disclosure. Among the components in the embodiments described below, the components that are not described in the independent claims are described as optional components. In addition, the sizes or the ratios of the sizes of the components illustrated in the drawings are not necessarily strictly indicated.

First Embodiment

[1.1 Circuit Configuration of Communication Apparatus]

FIG. 1 is a diagram illustrating a circuit configuration of a communication apparatus 1 according to a first embodiment. The communication apparatus 1 illustrated in FIG. 1 includes a switch 2, a transmission-reception module 10, and a radio-frequency (RF) signal processing circuit (radio-frequency integrated circuit (RFIC)) 3. The communication apparatus 1 is disposed in, for example, a front-end unit of a multimode-multiband cellular phone.

The switch 2 includes a common terminal and multiple selection terminals and switches between connections of the common terminal to the respective multiple selection terminals. The number of the multiple selection terminals is arbitrary. The common terminal of the switch 2 is connected to, for example, an antenna element, and each of the multiple selection terminals is connected to the transmission-reception module that transmits and receives high-frequency signals in a certain frequency band.

The transmission-reception module 10 includes a high-frequency module 20, a transmission-side filter 31, a matching circuit 32, and a power amplifier (PA) 33.

The high-frequency module 20 includes a reception-side filter 21, a matching circuit 22, and a low noise amplifier (LNA) 23.

The reception-side filter 21 is a first filter that is connected to an input terminal P1 and a connection terminal P2 and that uses a first frequency band (a reception band) as a pass band and a second frequency band (a transmission band) as an attenuation band.

The LNA 23 is a low noise amplifier that amplifies a high-frequency reception signal that is inputted from the input terminal P1 and is transmitted through the reception-side filter 21 and the matching circuit 22.

The matching circuit 22 is an impedance matching circuit that is disposed between the reception-side filter 21 and the LNA 23 and that matches the impedance of the reception-side filter 21 with the impedance of the LNA 23. The configuration and the effects and advantages of the matching circuit 22 will be described in detail below with reference to FIG. 3 and the subsequent drawings.

The transmission-side filter 31 is a third filter that uses the second frequency band (the transmission band) as the pass band and the first frequency band (the reception band) as the attenuation band.

The transmission-side filter 31 and the reception-side filter 21 are commonly connected to a certain selection terminal of the switch 2 and compose, for example, a duplexer of the transmission-reception module 10. With this configuration, the transmission-side filter 31 and the reception-side filter 21 are capable of concurrently transmitting a high-frequency transmission signal in the transmission band to the selection terminal of the switch 2 and the high-frequency reception signal in the reception band from the selection terminal to an output terminal P3 using a frequency division duplex (FDD) method. The transmission-side filter 31 and the matching circuit 32 may not be commonly connected to the certain selection terminal. A switch or another circuit element may be provided between the certain selection terminal and the transmission-side filter 31 and the reception-side filter 21.

The PA 33 is a power amplifier that amplifies a high-frequency signal supplied from the RF signal processing circuit (RFIC) 3 and supplies the amplified high-frequency signal to the matching circuit 32 and the transmission-side filter 31.

The matching circuit 32 is an impedance matching circuit that is disposed between the transmission-side filter 31 and the PA 33 and that matches the impedance of the transmission-side filter 31 with the impedance of the PA 33. The matching circuit 32 is not an essential element and may not be provided.

The RF signal processing circuit (RFIC) 3 performs signal processing, such as down-conversion, to the high-frequency reception signal supplied from the switch 2 through the transmission-reception module 10 and supplies the reception signal subjected to the signal processing to a baseband signal processing circuit (baseband integrated circuit (BBIC)). In addition, the RF signal processing circuit (RFIC) 3 performs signal processing, such as up-conversion, to the transmission signal supplied from the baseband signal processing circuit and supplies the high-frequency transmission signal subjected to the signal processing to a transmission-side signal path of the transmission-reception module 10.

The communication apparatus 1 further includes transmission-reception modules that have the same configuration as that of the transmission-reception module 10 and that use frequency bands different from the first frequency band as the reception band and frequency bands different from the second frequency band as the transmission band, although not illustrated in detail. In other words, the multiple transmission-reception modules that propagate signals in different frequency bands are respectively connected to the multiple selection terminals of the switch 2.

The communication apparatus 1 may not include the switch 2 and may be composed of one transmission-reception module 10 and the RF signal processing circuit (RFIC) 3.

FIG. 2 is a Smith chart representing the impedance of the reception-side filter 21 according to the first embodiment. The impedance when the reception-side filter 21 is viewed from an output end (the connection terminal P2) of the reception-side filter 21 is represented in the Smith chart in FIG. 2. The reception-side filter 21 is, for example, a surface acoustic wave (SAW) filter and has approximately 50Ω (characteristic impedance) in the reception band (the pass band). For example, when the transmission band is at the low frequency side of the reception band in the transmission-reception module 10, the impedance in the transmission band of the reception-side filter 21 is positioned at the low impedance side of the characteristic impedance, as illustrated in FIG. 2. In contrast, when the transmission band is at the high frequency side of the reception band, the impedance in the transmission band of the reception-side filter 21 is positioned at the high impedance side of the characteristic impedance.

The reception-side filter 21 and the transmission-side filter 31 may be bulk acoustic wave (BAW) filters. In the case of the surface acoustic wave filter, the filter has a substrate and interdigital transducer (IDT) electrodes. The substrate has piezoelectricity at least on the surface. For example, the substrate may have a piezoelectric thin film on the surface and may be composed of a multilayer body including a film different from the piezoelectric thin film in acoustic velocity, a supporting substrate, and so on. The substrate may have piezoelectricity on the entire substrate. In this case, the substrate is a piezoelectric substrate composed of one piezoelectric layer.

FIG. 3 includes Smith charts indicating the positional relationship between the impedance of the reception-side filter 21 and maximum gain of the LNA 23 in the high-frequency module 20 according to the first embodiment. In the Smith chart at the left side of FIG. 3, the impedance when the reception-side filter 21 is viewed from the output end (the connection terminal P2) of the reception-side filter 21 and a gain circle (equal gain circle) in the reception band of the LNA 23 at the output end (the connection terminal P2) are indicated. In contrast, in the Smith chart at the right side of FIG. 3, the impedance when the reception-side filter 21 is viewed from the output end (the connection terminal P2) of the reception-side filter 21 and the gain circle (equal gain circle) in the transmission band of the LNA 23 at the output end (the connection terminal P2) are indicated.

In the Smith charts in FIG. 3, an interval LT between impedance $Z_{FT}$ in the transmission band when the reception-side filter 21 is viewed from the output end (the connection terminal P2) and Tx band maximum gain $Z_{LTMax}$ (a second gain circle center point) indicating the impedance at which the gain in the transmission band of the LNA 23 at the output end (the connection terminal P2) is maximized is greater than an interval LR between impedance $Z_{FR}$ in the reception band when the reception-side filter 21 is viewed from the output end (the connection terminal P2) and Rx band maximum gain $Z_{LRMax}$ (a first gain circle center point) indicating the impedance at which the gain in the reception band of the LNA 23 at the output end (the connection terminal P2) is maximized.

Since the impedance matching circuit disposed between the reception-side filter and the LNA has hitherto been aimed at propagation of the high-frequency reception signal on the signal path on which the reception-side filter is disposed with low loss, the impedance matching circuit is mainly intended for the impedance matching between the reception-side filter and the LNA in the reception band. In this case, if attenuation characteristics are not sufficiently ensured in the reception-side filter itself when the high-frequency transmission signal of strong input enters the LNA, distortion or gain reduction occurs in the LNA and the RF signal processing circuit (RFIC). As measures against this, for example, a reception-side filter that places emphasis on the attenuation characteristics in the transmission band is disposed as the reception-side filter to resolve the above problem. However, since the reception-side filter that places emphasis on the attenuation characteristics in the transmission band is concurrently accompanied by an increase in passing loss in the reception band, the disposition of such a reception-side filter leads to degradation of gain characteristics and a noise figure of the reception signal path.

In contrast, in the high-frequency module 20 according to the present embodiment, the matching circuit 22 has a configuration to make the interval LT greater than the interval LR.

With this configuration, the impedance (the second gain circle center point) at the maximum gain in the transmission band (the attenuation band) of the LNA 23 is capable of being relatively apart from the impedance in the transmission band of the reception-side filter 21 by varying the topology of the impedance matching circuit provided upstream of the LNA 23. Accordingly, since gain mismatch is caused between the LNA 23 and the reception-side filter 21 in the transmission band (the attenuation band), the signal component in the transmission band (the attenuation band), which can be supplied to the downstream of the LNA 23, is capable of being attenuated at the upstream of the LNA 23 by an amount greater than or equal to the attenuation defined in the reception-side filter 21. In addition, since it is not necessary to add a new matching circuit at the downstream of the reception-side filter 21 and the downstream of the LNA 23 in the attenuation of the signal component in the transmission band (the attenuation band), it is possible to suppress the degradation of the noise figure of the high-frequency module 20.

[1.2 High-Frequency Module in First Example]

Figure 4A:
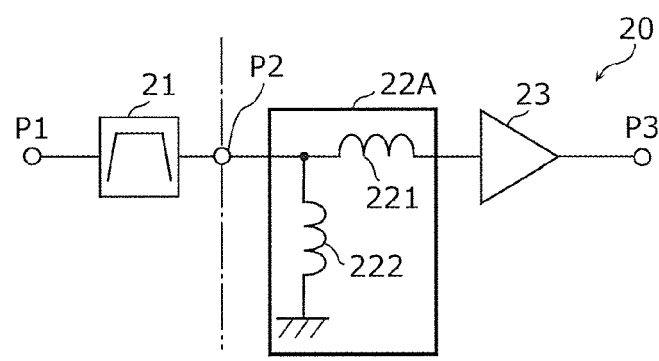
FIG. 4A is a diagram illustrating a circuit configuration of the high-frequency module according to a first example.

FIG. 4A is a diagram illustrating a circuit configuration of the high-frequency module 20 according to a first example. In the high-frequency module 20 according to the present example, an example of the specific circuit configuration of the matching circuit 22 in the high-frequency module 20 according to the first embodiment is illustrated. As illustrated in FIG. 4A, the high-frequency module 20 according to the present example includes the reception-side filter 21, a matching circuit 22A, and the LNA 23.

In the reception-side filter 21 according to the present example, the attenuation band (the transmission band) is positioned at the low frequency side of the pass band (the reception band). The reception-side filter 21 is, for example, a reception filter applied to Band8 (transmission band of 880 MHz to 910 MHz: reception band of 925 MHz to 960 MHz) in Long Term Evolution (LTE).

The matching circuit 22A includes an inductor 221 connected in series between the connection terminal P2 and an input end of the LNA 23 and an inductor 222 connected between the connection terminal P2 and ground. With this configuration, the matching circuit 22A composes a high pass circuit that attenuates the signal component in the attenuation band (the transmission band) and transmits the signal component in the pass band (the reception band).

Figure 4B:
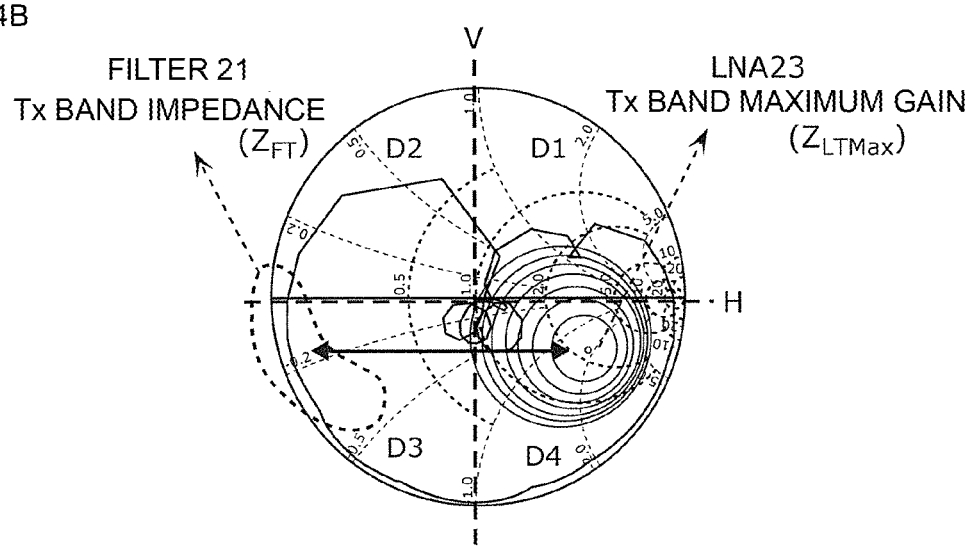
FIG. 4B is a Smith chart indicating the positional relationship between the impedance of the reception-side filter and the maximum gain of the low noise amplifier in the high-frequency module according to the first example.

FIG. 4B is a Smith chart indicating the positional relationship between the impedance of the reception-side filter 21 and the maximum gain of the LNA 23 in the high-frequency module 20 according to the first example.

The interval LT between the impedance $Z_{FT}$ and the Tx band maximum gain $Z_{LTMax}$ is greater than the interval LR between the impedance $Z_{FR}$ and the Rx band maximum gain $Z_{LRMax}$, as illustrated in FIG. 3, although not illustrated in FIG. 4B.

In addition, as illustrated in FIG. 4B, in the above Smith chart, areas D1, D2, D3, and D4 resulting from division into four portions along a vertical line V and a horizontal line H through the characteristic impedance (50Ω) are defined. Here, the impedance $Z_{FT}$ is positioned in the area D3 (at the low impedance side). In contrast, the Tx band maximum gain $Z_{LTMax}$ (the second gain circle center point) is positioned in the area D4 (at the high impedance side). In other words, the impedance $Z_{FT}$ and the Tx band maximum gain $Z_{LTMax}$ (the second gain circle center point) are positioned in different areas.

With the above configuration, the matching circuit 22A has both (1) a gain mismatch function between the LNA 23 and the reception-side filter 21 in the attenuation band (the transmission band) and (2) a high pass function to attenuate the signal component in the attenuation band (the transmission band: at the low frequency side) and transmit the signal component in the pass band (the reception band: at the high frequency side). Accordingly, the matching circuit 22A is capable of effectively attenuating the signal component in the attenuation band (the transmission band), which can be supplied to the downstream of the LNA 23, at the upstream of the LNA 23.

FIGS. 5A, 5B, 5C and 5D include graphs indicating the gains and the noise figure of the high-frequency module 20 according to the first example. FIG. 5A indicates the gain (the bandpass characteristic) in the reception band of the high-frequency module 20 according to the present example, FIG. 5B indicates the noise figure in the reception band of the high-frequency module 20 according to the present example, FIG. 5C indicates the gain (the attenuation characteristic and the bandpass characteristic) in the transmission band and the reception band of the high-frequency module 20 according to the present example, and FIG. 5D indicates a circuit configuration of the high-frequency module 20 according to the present example.

In contrast, FIGS. 6A, 6B, 6C and 6D include graphs indicating the gains and the noise figure of a high-frequency module 520 according to a comparative example. The high-frequency module 520 according to the comparative example differs from the high-frequency module 20 according to the first example only in the configuration of the matching circuit, as illustrated in FIG. 6D. The high-frequency module 520 includes the reception-side filter 21, a matching circuit 522, and the LNA 23. The matching circuit 522 includes two inductors connected in series between the reception-side filter 21 and the LNA 23. In other words, the matching circuit 522 composes not the high pass circuit that attenuates the high-frequency signal at the low frequency side and transmits the high-frequency signal at the high frequency side, but a low pass circuit that transmits the high-frequency signal at the low frequency side and attenuates the high-frequency signal at the high frequency side. FIG. 6A indicates the gain (the bandpass characteristic) in the reception band of the high-frequency module 520 according to the present comparative example, FIG. 6B indicates the noise figure in the reception band of the high-frequency module 520 according to the present comparative example, and FIG. 6C indicates the gain (the attenuation characteristic and the bandpass characteristic) in the transmission band and the reception band of the high-frequency module 520 according to the present comparative example.

FIGS. 7A, 7B and 7C include graphs resulting from the comparison between the gain and the noise figure of the high-frequency module according to the first example and those of the high-frequency module according to the comparative example. FIG. 7A indicates that little difference exists between the high-frequency module 20 according to the first example and the high-frequency module 520 according to the comparative example in the gain in the pass band (the reception band). In contrast, FIG. 7B indicates that the noise figure in the pass band (the reception band) is improved in the high-frequency module 20 according to the first example, compared with that in the high-frequency module 520 according to the comparative example.

Figure 8:
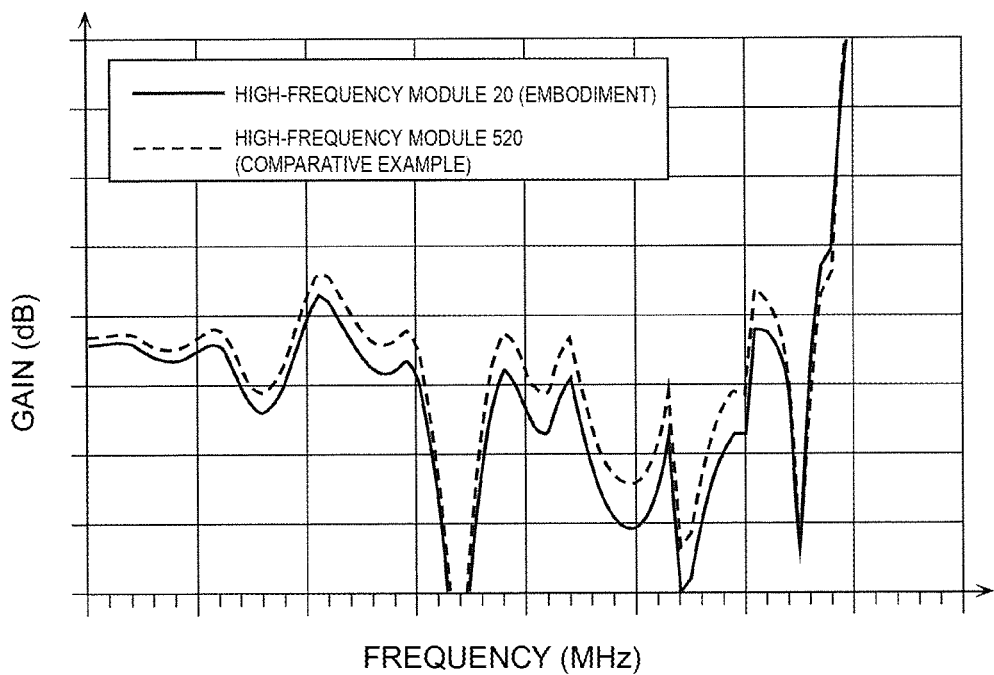
FIG. 8 is a graph resulting from the comparison between an attenuation characteristic of the high-frequency module according to the first example with that of the high-frequency module according to the comparative example.

FIG. 8 is a graph resulting from the comparison between the attenuation characteristic in the attenuation band (the transmission band) of the high-frequency module according to the first example with that of the high-frequency module according to the comparative example. FIG. 8 indicates that the attenuation characteristic in the attenuation band (the transmission band) is improved in the almost entire transmission band in the high-frequency module 20 according to the first example, compared with that in the high-frequency module 520 according to the comparative example.

[1.3 High-Frequency Module According to First Modification]

Figure 9A:
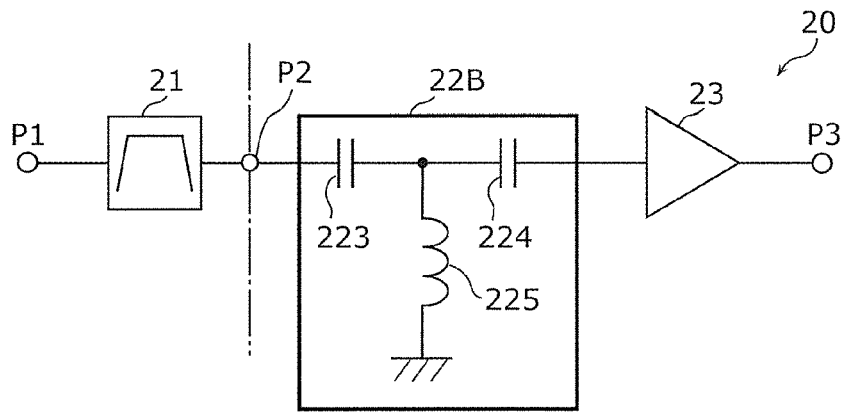
FIG. 9A is a diagram illustrating a circuit configuration of the high-frequency module according to a first modification of the first embodiment.

FIG. 9A is a diagram illustrating a circuit configuration of the high-frequency module 20 according to a first modification of the first embodiment. The high-frequency module 20 according to the present modification differs from the high-frequency module 20 according to the first example only in the circuit configuration of the matching circuit. As illustrated in FIG. 9A, the high-frequency module 20 according to the present modification includes the reception-side filter 21, a matching circuit 22B, and the LNA 23.

In the reception-side filter 21 according to the present modification, the attenuation band (the transmission band) is positioned at the low frequency side of the pass band (the reception band), as in the reception-side filter 21 according to the first example.

The matching circuit 22B includes capacitors 223 and 224 connected in series between the connection terminal P2 and the input end of the LNA 23 and an inductor 225 connected between a connection node between the capacitors 223 and 224 and the ground. With this configuration, the matching circuit 22B composes a high pass circuit that attenuates the signal component in the attenuation band (the transmission band) and transmits the signal component in the pass band (the reception band).

In the present modification, the matching circuit 22B has both (1) the gain mismatch function between the LNA 23 and the reception-side filter 21 in the attenuation band (the transmission band) and (2) the high pass function to attenuate the signal component in the attenuation band (the transmission band) and transmit the signal component in the pass band (the reception band). Accordingly, the matching circuit 22B is capable of effectively attenuating the signal component in the attenuation band (the transmission band), which can be supplied to the downstream of the LNA 23, at the upstream of the LNA 23.

Figure 9B:
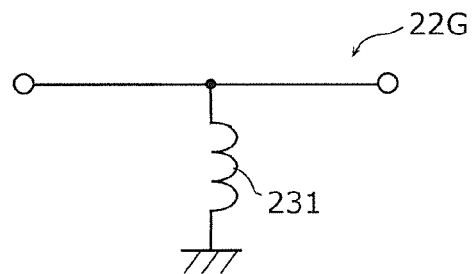
FIG. 9B is a diagram illustrating the configuration of a matching circuit according to a second modification of the first embodiment.

In addition, the matching circuit in the high-frequency module 20 according to the present embodiment may have the circuit configuration illustrated in FIG. 9B.

FIG. 9B is a diagram illustrating the configuration of a matching circuit 22G according to a second modification of the first embodiment. The matching circuit 22G includes an inductor 231 connected between a path between the connection terminal P2 and the LNA 23 and the ground. With this configuration, the matching circuit 22G composes a high pass circuit that attenuates the signal component in the attenuation band (the transmission band) and transmits the signal component in the pass band (the reception band).

[1.4 high-Frequency Module According to Second Example]

The present example differs from the first example in that, in the reception-side filter 21, the attenuation band (the transmission band) is positioned at the high frequency side of the pass band (the reception band).

Figure 10A:
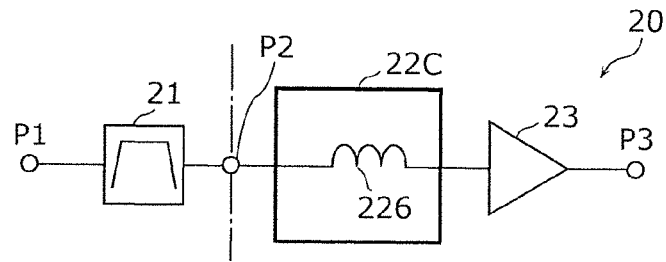
FIG. 10A is a diagram illustrating a circuit configuration of the high-frequency module according to a second example.

FIG. 10A is a diagram illustrating a circuit configuration of the high-frequency module 20 according to a second example. In the high-frequency module 20 according to the present example, an example of the specific circuit configuration of the matching circuit 22 in the high-frequency module 20 according to the first embodiment is illustrated. As illustrated in FIG. 10A, the high-frequency module 20 according to the present example includes the reception-side filter 21, a matching circuit 22C, and the LNA 23.

As described above, in the reception-side filter 21 according to the present example, the attenuation band (the transmission band) is positioned at the high frequency side of the pass band (the reception band).

The matching circuit 22C only includes an inductor 226 connected in series between the connection terminal P2 and the input end of the LNA 23. With this configuration, the matching circuit 22C composes a low pass circuit that transmits the signal component in the pass band (the reception band) and attenuates the signal component in the attenuation band (the transmission band).

Figure 10B:
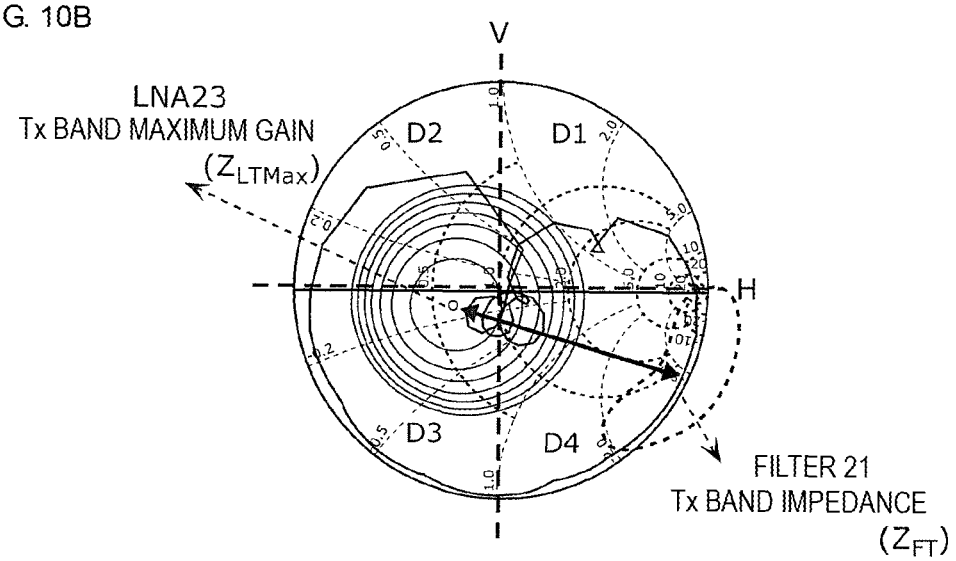
FIG. 10B is a Smith chart indicating the positional relationship between the impedance of the reception-side filter and the maximum gain of the low noise amplifier in the high-frequency module according to the second example.

FIG. 10B is a Smith chart indicating the positional relationship between the impedance of the reception-side filter 21 and the maximum gain of the LNA 23 in the high-frequency module 20 according to the second example.

The interval LT between the impedance $Z_{FT}$ and the Tx band maximum gain $Z_{LTMax}$ is greater than the interval LR between the impedance $Z_{FR}$ and the Rx band maximum gain $Z_{LRMax}$, as illustrated in FIG. 3, although not illustrated in FIG. 10B.

In addition, as illustrated in FIG. 10B, in the above Smith chart, the areas D1, D2, D3, and D4 resulting from division into four portions along the vertical line V and the horizontal line H through the characteristic impedance (50Ω) are defined. Here, the impedance $Z_{FT}$ is positioned in the area D4 (at the high impedance side). In contrast, the Tx band maximum gain $Z_{LTMax}$ (the second gain circle center point) is positioned in the area D3 (at the low impedance side). In other words, the impedance $Z_{FT}$ and the Tx band maximum gain $Z_{LTMax}$ (the second gain circle center point) are positioned in different areas.

With the above configuration, the matching circuit 22C has both (1) the gain mismatch function between the LNA 23 and the reception-side filter 21 in the attenuation band (the transmission band) and (2) a low pass function to transmit the signal component in the pass band (the reception band) and attenuate the signal component in the attenuation band (the transmission band). Accordingly, the matching circuit 22C is capable of effectively attenuating the signal component in the attenuation band (the transmission band), which can be supplied to the downstream of the LNA 23, at the upstream of the LNA 23.

[1.5 High-Frequency Module According to Third Modification]

Figure 11A:
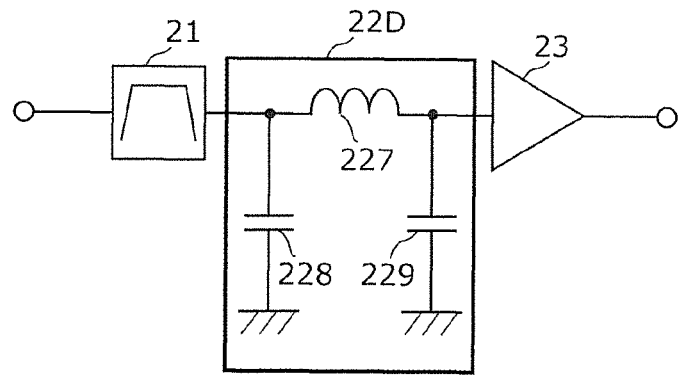
FIG. 11A is a diagram illustrating a circuit configuration of the high-frequency module according to a third modification of the first embodiment.

FIG. 11A is a diagram illustrating a circuit configuration of the high-frequency module 20 according to a third modification. The high-frequency module 20 according to the present modification differs from the high-frequency module 20 according to the second example only in the circuit configuration of the matching circuit. As illustrated in FIG. 11A, the high-frequency module 20 according to the present modification includes the reception-side filter 21, a matching circuit 22D, and the LNA 23.

In the reception-side filter 21 according to the present modification, the attenuation band (the transmission band) is positioned at the high frequency side of the pass band (the reception band), as in the reception-side filter 21 according to the second example.

The matching circuit 22D includes an inductor 227 connected in series between the connection terminal P2 and the input end of the LNA 23, a capacitor 228 connected between a connection node between the reception-side filter 21 and the inductor 227 and the ground, and a capacitor 229 connected between a connection node between the LNA 23 and the inductor 227 and the ground. With this configuration, the matching circuit 22D composes a low pass circuit that transmits the signal component in the pass band (the reception band) and attenuates the signal component in the attenuation band (the transmission band).

In the present modification, the matching circuit 22D has both (1) the gain mismatch function between the LNA 23 and the reception-side filter 21 in the attenuation band (the transmission band) and (2) the low pass function to transmit the signal component in the pass band (the reception band) and attenuate the signal component in the attenuation band (the transmission band). Accordingly, the matching circuit 22D is capable of effectively attenuating the signal component in the attenuation band (the transmission band), which can be supplied to the downstream of the LNA 23, at the upstream of the LNA 23.

Figure 11B:
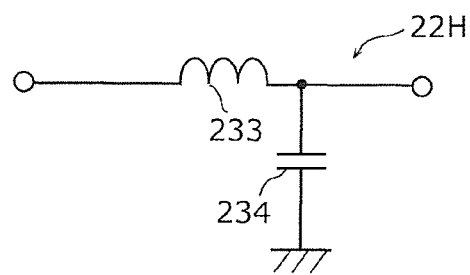
FIG. 11B is a diagram illustrating a circuit configuration of a matching circuit according to a fourth modification of the first embodiment.
Figure 11C:
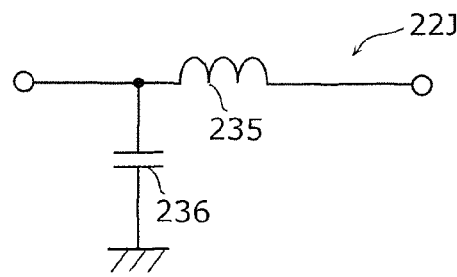
FIG. 11C is a diagram illustrating a circuit configuration of a matching circuit according to a fifth modification of the first embodiment.
Figure 11D:
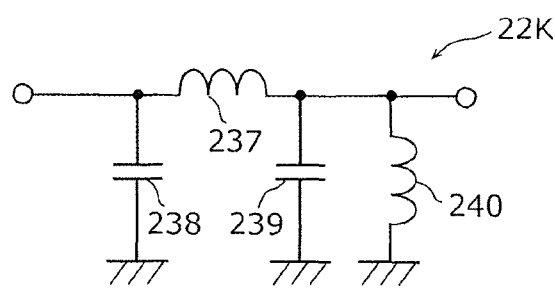
FIG. 11D is a diagram illustrating a circuit configuration of a matching circuit according to a sixth modification of the first embodiment.

In addition, the matching circuit in the high-frequency module 20 according to the present embodiment may have the circuit configurations illustrated in FIG. 11B to FIG. 11D.

FIG. 11B is a diagram illustrating a circuit configuration of a matching circuit 22H according to a fourth modification of the first embodiment. The matching circuit 22H includes an inductor 233 connected in series between the connection terminal P2 and the input end of the LNA 23 and a capacitor 234 connected between a path between the inductor 233 and the LNA 23 and the ground. With this configuration, the matching circuit 22H composes a low pass circuit that transmits the signal component in the pass band (the reception band) and attenuates the signal component in the attenuation band (the transmission band).

FIG. 11C is a diagram illustrating a circuit configuration of a matching circuit 22J according to a fifth modification of the first embodiment. The matching circuit 22J includes an inductor 235 connected in series between the connection terminal P2 and the input end of the LNA 23 and a capacitor 236 connected between a path between the connection terminal P2 and the inductor 235 and the ground. With this configuration, the matching circuit 22J composes a low pass circuit that transmits the signal component in the pass band (the reception band) and attenuates the signal component in the attenuation band (the transmission band).

FIG. 11D is a diagram illustrating a circuit configuration of a matching circuit 22K according to a sixth modification of the first embodiment. The matching circuit 22K includes an inductor 237 connected in series between the connection terminal P2 and the input end of the LNA 23, a capacitor 238 connected between a connection node between the reception-side filter 21 and the inductor 237 and the ground, a capacitor 239 connected between a connection node between the LNA 23 and the inductor 237 and the ground, and an inductor 240 connected between a connection node between the LNA 23 and the inductor 237 and the ground. With this configuration, the matching circuit 22K composes a low pass circuit that transmits the signal component in the pass band (the reception band) and attenuates the signal component in the attenuation band (the transmission band).

Second Embodiment

A high-frequency module according to the present embodiment further includes a phase shifter that shifts the phase of the impedance of the reception-side filter 21, in addition to the components in the high-frequency module 20 according to the first embodiment.

Figure 12A:
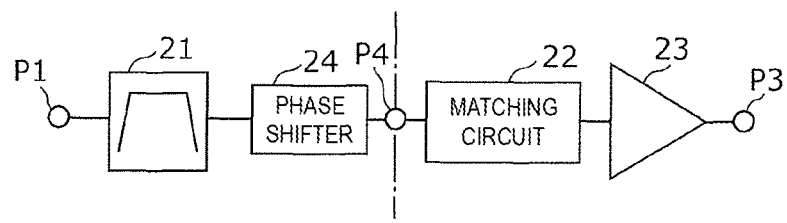
FIG. 12A is a diagram illustrating a circuit configuration of a high-frequency module according to a second embodiment.

FIG. 12A is a diagram illustrating a circuit configuration of a high-frequency module according to a second embodiment. The high-frequency module according to the present embodiment, illustrated in FIG. 12A, includes the reception-side filter 21, the matching circuit 22, the LNA 23, and a phase shifter 24.

The reception-side filter 21 is the first filter that is connected to the input terminal P1 and the connection terminal P2 and that uses the first frequency band (the reception band) as the pass band and the second frequency band (the transmission band) as the attenuation band.

The LNA 23 is a low noise amplifier that amplifies a high-frequency reception signal that is inputted from the input terminal P1 and is transmitted through the reception-side filter 21 and the matching circuit 22.

The matching circuit 22 is an impedance matching circuit that is disposed between the reception-side filter 21 and the LNA 23 and that matches the impedance of the reception-side filter 21 with the impedance of the LNA 23.

The phase shifter 24 is disposed between the reception-side filter 21 and the LNA 23 and has a function to shift the phase of the impedance of the reception-side filter 21. Although the phase shifter 24 is positioned between the reception-side filter 21 and the matching circuit 22 in the present embodiment, the phase shifter 24 may be disposed between the matching circuit 22 and the LNA 23.

Figure 12B:
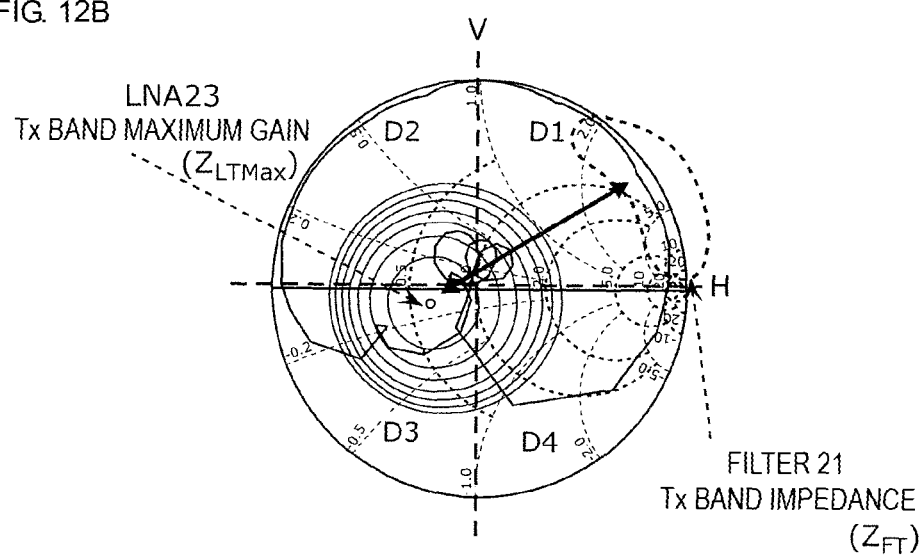
FIG. 12B is a Smith chart indicating the positional relationship between the impedance of the reception-side filter and the maximum gain of the low noise amplifier in the high-frequency module according to the second embodiment.

FIG. 12B is a Smith chart indicating the positional relationship between the impedance of the reception-side filter 21 and the maximum gain of the LNA 23 in the high-frequency module according to the second embodiment.

The interval LT between the impedance $Z_{FT}$ in the transmission band when the reception-side filter 21 is viewed from an output end (a connection terminal P4) of the phase shifter 24 and the Tx band maximum gain $Z_{LTMax}$ (the second gain circle center point) indicating the impedance at which the gain in the transmission band of the LNA 23 at the output end (the connection terminal P4) is maximized is greater than the interval LR between the impedance $Z_{FR}$ in the reception band when the reception-side filter 21 is viewed from the output end (the connection terminal P4) and the Rx band maximum gain $Z_{LRMax}$ (the first gain circle center point) indicating the impedance at which the gain in the reception band of the LNA 23 at the output end (the connection terminal P4) is maximized, as illustrated in FIG. 3, although not illustrated in FIG. 12B.

In addition, as illustrated in FIG. 12B, in the Smith chart, the disposition of the phase shifter 24 inverts the phase of the impedance when the reception-side filter 21 is viewed from the connection terminal P4, compared with that of the impedance when the reception-side filter 21 is viewed from the connection terminal P2, illustrated in FIG. 2. In the above Smith chart, the areas D1, D2, D3, and D4 resulting from division into four portions along the vertical line V and the horizontal line H through the characteristic impedance (50Ω) are defined. Here, the impedance $Z_{FT}$ in the attenuation band (the transmission band) when the reception-side filter 21 is viewed from the output end (the connection terminal P4) of the phase shifter 24 is positioned in the area D1 (at the high impedance side). In contrast, the Tx band maximum gain $Z_{LTMax}$ (the second gain circle center point) is positioned in the area D3 (at the low impedance side). In other words, the impedance $Z_{FT}$ and the Tx band maximum gain $Z_{LTMax}$ (the second gain circle center point) are positioned in different areas.

With the above configuration, since the phase shifter 24 is capable of shifting the phase of the impedance in the attenuation band of the reception-side filter 21, the positional relationship between the impedance (the second gain circle center point) at the maximum gain in the attenuation band of the LNA 23 and the impedance in the attenuation band of the reception-side filter 21 is capable of being easily adjusted with high accuracy. As a result, the phase shifter 24 and the matching circuit 22 are capable of effectively attenuating the signal component in the attenuation band (the transmission band), which can be supplied to the downstream of the LNA 23, at the upstream of the LNA 23.

Third Embodiment

[3.1 Circuit Configuration of High-Frequency Module]

In the present embodiment, the configuration of a high-frequency module including multiple signal paths on which high-frequency signals in different frequency bands are propagated will be described.

Figure 13:
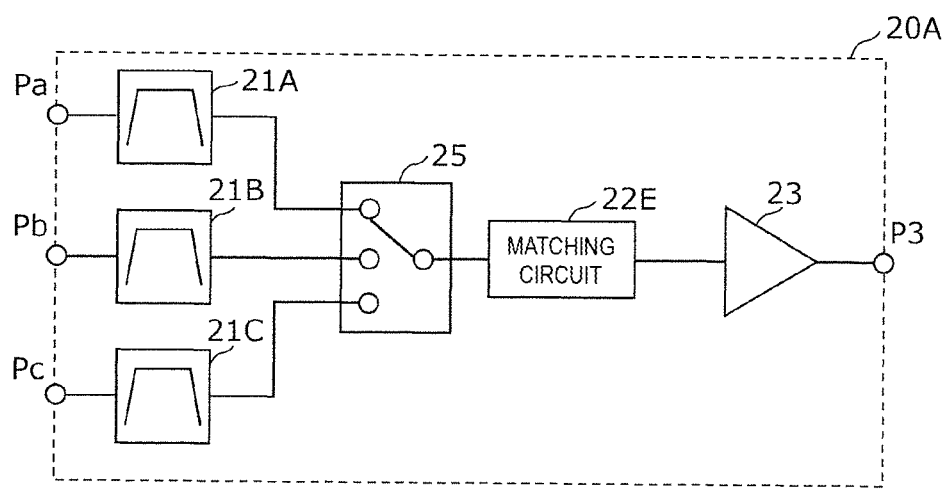
FIG. 13 is a diagram illustrating a circuit configuration of a high-frequency module according to a third embodiment.

FIG. 13 is a diagram illustrating a circuit configuration of a high-frequency module 20A according to a third embodiment. As illustrated in FIG. 13, the high-frequency module 20A includes reception-side filters 21A, 21B, and 21C, a switch 25, a matching circuit 22E, and the LNA 23.

The reception-side filter 21A is the first filter that is connected to an input terminal Pa and a first selection terminal of the switch 25 and that uses the first frequency band (the reception band) as the pass band and the second frequency band (the transmission band) as the attenuation band.

The reception-side filter 21B is a second filter that is connected to an input terminal Pb and a second selection terminal of the switch 25 and that uses a third frequency band (the reception band) as the pass band and a fourth frequency band (the transmission band) as the attenuation band.

The reception-side filter 21C is a fourth filter that is connected to an input terminal Pc and a third selection terminal of the switch 25 and that uses a fifth frequency band (the reception band) as the pass band and a sixth frequency band (the transmission band) as the attenuation band.

The input terminals Pa, Pb, and Pc may be commonly connected or may be individually connected to the respective selection terminals of the switch 2 of the communication apparatus 1.

The switch 25 is a switch circuit that has three selection terminals and one common terminal and that switches between a conducting state and a non-conducting state between the reception-side filter 21A and the matching circuit 22E, switches between the conducting state and the non-conducting state between the reception-side filter 21B and the matching circuit 22E, and switches between the conducting state and the non-conducting state between the reception-side filter 21C and the matching circuit 22E.

The LNA 23 is a low noise amplifier that amplifies a high-frequency reception signal that is inputted from the input terminal Pa, Pb, or Pc and is transmitted through the reception-side filter 21A, 21B, or 21C and the matching circuit 22E.

The matching circuit 22E is an impedance matching circuit that is disposed between the switch 25 and the LNA 23 and that matches the impedances of the reception-side filters 21A, 21B, and 21C with the impedance of the LNA 23.

In the high-frequency module 20A according to the present embodiment, either of relationship (1) the first frequency band is at the high frequency side of the second frequency band, the third frequency band is at the high frequency side of the fourth frequency band, and the fifth frequency band is at the high frequency side of the sixth frequency band and relationship (2) the first frequency band is at the low frequency side of the second frequency band, the third frequency band is at the low frequency side of the fourth frequency band, and the fifth frequency band is at the low frequency side of the sixth frequency band is met.

A circuit that performs the impedance matching between the reception-side filter 21A and the LNA 23 is not disposed between the reception-side filter 21A and the switch 25, a circuit that performs the impedance matching between the reception-side filter 21B and the LNA 23 is not disposed between the reception-side filter 21B and the switch 25, and a circuit that performs the impedance matching between the reception-side filter 21C and the LNA 23 is not disposed between the reception-side filter 21C and the switch 25.

In the Smith chart, when the reception-side filter 21A is connected to the matching circuit 22E with the switch 25 disposed therebetween, an interval LAT between impedance $ZA_{FT}$ in the second frequency band when the reception-side filter 21A is viewed from the first selection terminal and Tx band maximum gain $ZA_{LTMax}$ indicating the impedance at which the gain in the second frequency band of the LNA 23 at the first selection terminal is maximized is greater than an interval LAR between impedance $ZA_{FR}$ in the first frequency band when the reception-side filter 21A is viewed from the first selection terminal and Rx band maximum gain $ZA_{LRMax}$ indicating the impedance at which the gain in the first frequency band of the LNA 23 at the first selection terminal is maximized. In addition, when the reception-side filter 21B is connected to the matching circuit 22E with the switch 25 disposed therebetween, an interval LBT between impedance $ZB_{FT}$ in the fourth frequency band when the reception-side filter 21B is viewed from the second selection terminal and Tx band maximum gain $ZB_{LTMax}$ indicating the impedance at which the gain in the fourth frequency band of the LNA 23 at the second selection terminal is maximized is greater than an interval LCR between impedance $ZB_{FR}$ in the third frequency band when the reception-side filter 21B is viewed from the second selection terminal and Rx band maximum gain $ZB_{LRMax}$ indicating the impedance at which the gain in the third frequency band of the LNA 23 at the second selection terminal is maximized. Furthermore, when the reception-side filter 21C is connected to the matching circuit 22E with the switch 25 disposed therebetween, an interval LCT between impedance $ZC_{FT}$ in the sixth frequency band when the reception-side filter 21C is viewed from the third selection terminal and Tx band maximum gain $ZC_{LTMax}$ indicating the impedance at which the gain in the sixth frequency band of the LNA 23 at the third selection terminal is maximized is greater than an interval LBR between impedance $ZC_{FR}$ in the fifth frequency band when the reception-side filter 21C is viewed from the third selection terminal and Rx band maximum gain $ZC_{LRMax}$ indicating the impedance at which the gain in the fifth frequency band of the LNA 23 at the third selection terminal is maximized.

With the above configuration, since the reception-side filters 21A, 21B, and 21C have the same high-low relationship of the frequencies of the pass band and the attenuation band, the impedance matching circuit is capable of being composed with the same topology. Accordingly, the impedances at the maximum gains in the second frequency band, the fourth frequency band, and the sixth frequency band of the LNA 23 are capable of being relatively apart from the impedances in the attenuation bands (the second frequency band, the fourth frequency band, and the sixth frequency band) of the reception-side filters 21A, 21B, and 21C only with the common matching circuit 22E disposed between the switch 25 and the LNA 23. In other words, since the gain mismatch is caused between the LNA 23 and the reception-side filters 21A, 21B, and 21C in the above attenuation bands, the signal components in the attenuation bands, which can be supplied to the downstream of the LNA 23, are capable of being attenuated at the upstream of the LNA 23 by an amount greater than or equal to the attenuation characteristics defined in the reception-side filters 21A, 21B, and 21C. Accordingly, it is possible to suppress the degradation of the reception sensitivity in the first frequency band, the third frequency band, and the fifth frequency band. In addition, since it is not necessary to add a new matching circuit at the upstream of the switch 25 and the downstream of the LNA 23 in the attenuation of the above signal components, it is possible to suppress the degradation of the noise figure while reducing the size of the high-frequency module 20A.

[3.2 Circuit Configuration of High-Frequency Module According to Modification]

Figure 14:
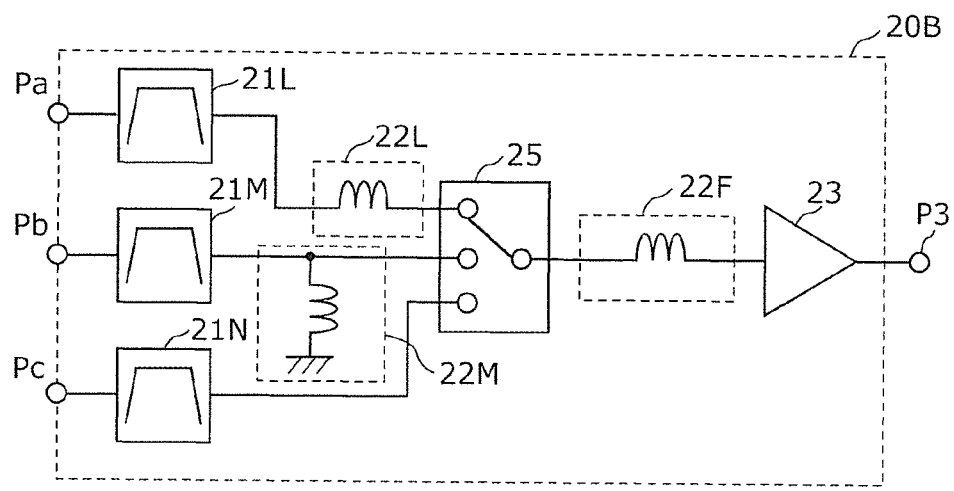
FIG. 14 is a diagram illustrating a circuit configuration of a high-frequency module according to a modification of the third embodiment.

FIG. 14 is a diagram illustrating a circuit configuration of a high-frequency module 20B according to a modification of the third embodiment. The high-frequency module 20B according to the present modification differs from the high-frequency module 20A according to the third embodiment in that the three reception-side filters have different high-low relationships of the frequencies of the pass bands and the attenuation bands and in that matching circuits are disposed between the reception-side filters and the switch. A description of the same points of the high-frequency module 20B according to the present modification as those in the high-frequency module 20A according to the third embodiment is omitted herein and a description of different points will be mainly given.

As illustrated in FIG. 14, the high-frequency module 20B includes reception-side filters 21L, 21M, and 21N, the switch 25, matching circuits 22L, 22M, and 22F, and the LNA 23.

The reception-side filter 21L is the first filter that is connected to the input terminal Pa and the first selection terminal of the switch 25 and that uses the first frequency band (the reception band) as the pass band and the second frequency band (the transmission band) as the attenuation band. The second frequency band (the transmission band) is positioned at the low frequency side of the first frequency band (the reception band).

The reception-side filter 21M is the second filter that is connected to the input terminal Pb and the second selection terminal of the switch 25 and that uses the third frequency band (the reception band) as the pass band and the fourth frequency band (the transmission band) as the attenuation band. The fourth frequency band (the transmission band) is positioned at the high frequency side of the third frequency band (the reception band).

The reception-side filter 21N is the fourth filter that is connected to the input terminal Pc and the third selection terminal of the switch 25 and that uses the fifth frequency band (the reception band) as the pass band and the sixth frequency band (the transmission band) as the attenuation band. The sixth frequency band (the transmission band) is positioned at the low frequency side of the fifth frequency band (the reception band).

The input terminals Pa, Pb, and Pc may be commonly connected or may be individually connected to the respective selection terminals of the switch 2 of the communication apparatus 1.

The switch 25 is a switch circuit that has three selection terminals and one common terminal and that switches between the conducting state and the non-conducting state between the reception-side filter 21L and the matching circuit 22F, switches between the conducting state and the non-conducting state between the reception-side filter 21M and the matching circuit 22F, and switches between the conducting state and the non-conducting state between the reception-side filter 21N and the matching circuit 22F.

The LNA 23 is a low noise amplifier that amplifies a high-frequency reception signal that is inputted from the input terminal Pa, Pb, or Pc and is transmitted through the reception-side filter 21L, 21M, or 21N and the matching circuit 22F.

The matching circuit 22F is an impedance matching circuit that is disposed between the switch 25 and the LNA 23 and that matches the impedances of the reception-side filters 21L, 21M, and 21N with the impedance of the LNA 23. In the present modification, the matching circuit 22F includes an inductor connected in series between the switch 25 and the LNA 23.

The matching circuit 22L is a first impedance matching circuit that is disposed between the reception-side filter 21L and the switch 25 and that matches the impedance of the reception-side filter 21L with the impedance of the LNA 23. In the present modification, the matching circuit 22L includes an inductor connected in series between the reception-side filter 21L and the switch 25.

The matching circuit 22M is a second impedance matching circuit that is disposed between the reception-side filter 21M and the switch 25 and that matches the impedance of the reception-side filter 21M with the impedance of the LNA 23. In the present modification, the matching circuit 22M includes an inductor connected between a connection node between the reception-side filter 21M and the switch 25 and the ground.

In the high-frequency module 20B according to the present modification, the high-low relationship in frequency between the first frequency band (the reception band) and the second frequency band (the transmission band) is opposite to the high-low relationship in frequency between the third frequency band (the reception band) and the fourth frequency band (the transmission band). In addition, the high-low relationship in frequency between the third frequency band (the reception band) and the fourth frequency band (the transmission band) is opposite to the high-low relationship in frequency between the fifth frequency band (the reception band) and the sixth frequency band (the transmission band).

In the Smith chart, when the reception-side filter 21L is connected to the matching circuit 22F with the switch 25 disposed therebetween, an interval LLT between impedance $ZL_{FT}$ in the second frequency band when the reception-side filter 21L is viewed from an output end of the reception-side filter 21L and Tx band maximum gain $ZL_{LTMax}$ indicating the impedance at which the gain in the second frequency band of the LNA 23 at the output end is maximized is greater than an interval LLR between impedance $ZL_{FR}$ in the first frequency band when the reception-side filter 21L is viewed from the output end and Rx band maximum gain $ZL_{LRMax}$ indicating the impedance at which the gain in the first frequency band of the LNA 23 at the output end is maximized. In addition, when the reception-side filter 21M is connected to the matching circuit 22F with the switch 25 disposed therebetween, an interval LMT between impedance $ZM_{FT}$ in the fourth frequency band when the reception-side filter 21M is viewed from an output end of the reception-side filter 21M and Tx band maximum gain $ZM_{LTMax}$ indicating the impedance at which the gain in the fourth frequency band of the LNA 23 at the output end is maximized is greater than an interval LMR between impedance $ZM_{FR}$ in the third frequency band when the reception-side filter 21M is viewed from the output end and Rx band maximum gain $ZM_{LRMax}$ indicating the impedance at which the gain in the third frequency band of the LNA 23 at the output end is maximized. Furthermore, when the reception-side filter 21N is connected to the matching circuit 22F with the switch 25 disposed therebetween, an interval LNT between impedance $ZN_{FT}$ in the sixth frequency band when the reception-side filter 21N is viewed from an output end of the reception-side filter 21N and Tx band maximum gain $ZN_{LTMax}$ indicating the impedance at which the gain in the sixth frequency band of the LNA 23 at the output end is maximized is greater than an interval LNR between impedance $ZN_{FR}$ in the fifth frequency band when the reception-side filter 21N is viewed from the output end and Rx band maximum gain $ZN_{LRMax}$ indicating the impedance at which the gain in the fifth frequency band of the LNA 23 at the output end is maximized.

With the above configuration, since the reception-side filters 21L and 21M have different high-low relationships of the frequencies of the pass band and the attenuation band and the reception-side filters 21M and 21N have different high-low relationships of the frequencies of the pass band and the attenuation band, it is necessary to compose the impedance matching circuits with different topologies. Accordingly, the common impedance element (the matching circuit 22F) is disposed between the switch 25 and the LNA 23 and the impedance elements that are not common are disposed between the reception-side filter 21L and the switch 25 (the matching circuit 22L) and between the reception-side filter 21M and the switch 25 (the matching circuit 22M), if needed. Accordingly, the impedances at the maximum gains in the second frequency band (the transmission band), the fourth frequency band (the transmission band), and the sixth frequency band (the transmission band) of the LNA 23 are capable of being relatively apart from the impedances in the attenuation bands of the reception-side filters 21L, 21M, and 21N. In other words, since the gain mismatch is caused between the LNA 23 and the reception-side filters 21L, 21M, and 21N in the above attenuation bands, the signal components in the attenuation bands, which can be supplied to the downstream of the LNA 23, are capable of being attenuated at the upstream of the LNA 23 by an amount greater than or equal to the attenuation characteristics defined in the reception-side filters 21L, 21M, and 21N. Accordingly, it is possible to suppress the degradation of the reception sensitivity in the first frequency band, the third frequency band, and the fifth frequency band. In addition, since it is not necessary to add a new matching circuit at the downstream of the LNA 23 in the attenuation of the above signal components, it is possible to suppress the degradation of the noise figure of the high-frequency module 20B.

In the present modification, on the signal path on which the signal in the first frequency band is propagated through the reception-side filter 21L, the matching circuits 22L and 22F are high pass circuits. On the signal path on which the signal in the third frequency band is propagated through the reception-side filter 21M, the matching circuits 22M and 22F are low pass circuits. On the signal path on which the signal in the fifth frequency band is propagated through the reception-side filter 21N, the matching circuit 22F is a high pass circuit. Accordingly, the matching circuits 22L, 22M and 22F are capable of effectively attenuating the signal components in the attenuation bands, which can be supplied to the downstream of the LNA 23, at the upstream of the LNA 23.

Although the configuration including the three signal paths on which the high-frequency signals in different frequency bands are propagated is exemplified as the high-frequency module in the third embodiment and the modification of the third embodiment, it is sufficient for the high-frequency module according to the present embodiment to have a configuration including two or more signal paths on which the high-frequency signals in different frequency bands are propagated.

Other Embodiments

Although the high-frequency modules, the transmission-reception module, and the communication apparatus according to the first to third embodiments of the present disclosure are described above, other embodiments realized by combining arbitrary components in the above embodiments, modifications resulting from making various changes supposed by the persons skilled in the art to the above embodiments without departing from the scope and spirit of the present disclosure, and various devices incorporating the high-frequency module, the transmission-reception module, and the communication apparatus according to the present disclosure are also included in the present disclosure.

In addition, in the high-frequency modules, the transmission-reception module, and the communication apparatus according to the present disclosure, circuit elements, such as an inductor, a capacitor, and a resistive element, may be added between the respective terminals.

The LNA 23 according to the first to third embodiments is preferably of a non-equilibrium input type (one input type). With the high-frequency modules according to the first to third embodiments, it is possible to suppress the degradation of the reception sensitivity and to reduce the sizes of the high-frequency modules even when the LNA 23 is of the non-equilibrium input type.

The present disclosure is widely available in communication devices, such as mobile phones, as the high-frequency module with high gain and low noise, the transmission-reception module, and the communication apparatus.

1 communication apparatus
2, 25 switch
3 RF signal processing circuit (RFIC)
10 transmission-reception module
20, 20A, 20B, 520 high-frequency module
21, 21A, 21B, 21C, 21L, 21M, 21N reception-side filter
22, 22A, 22B, 22C, 22D, 22E, 22F, 22G, 22H, 22J, 22K, 22L, 22M, 32, 522 matching circuit
23 LNA
24 phase shifter
31 transmission-side filter
33 PA
221, 222, 225, 226, 227, 231, 233, 235, 237, 240 inductor
223, 224, 228, 229, 234, 236, 238, 239 capacitor

The invention claimed is:

1. A high-frequency module comprising:
a first filter having a first frequency band as a pass band and a second frequency band as an attenuation band;
a low noise amplifier configured to amplify a high-frequency signal transmitted through the first filter; and
an impedance matching circuit that is disposed between the first filter and the low noise amplifier, wherein:
as seen in a Smith chart, due to the impedance matching circuit, an interval between a first impedance and a center point of a second gain circle is greater than an interval between a second impedance and a center point of a first gain circle,
the first impedance is in the second frequency band when the first filter is viewed from an output end of the first filter, the center point of the second gain circle indicates an impedance at which gain in the second frequency band of the low noise amplifier at the output end is maximized, the second impedance is in the first frequency band when the first filter is viewed from the output end of the first filter, and the center point of the first gain circle indicates an impedance at which gain in the first frequency band of the low noise amplifier at the output end is maximized.

2. The high-frequency module according to claim 1, wherein, when four areas resulting from division along a vertical line and a horizontal line through a characteristic impedance are defined in the Smith chart, the first impedance and the center point of the second gain circle are in different areas.

3. The high-frequency module according to claim 1, wherein, when the second frequency band is at a low frequency side of the first frequency band, the impedance matching circuit comprises a high pass circuit.

4. The high-frequency module according to claim 1, wherein, when the second frequency band is at a high frequency side of the first frequency band, the impedance matching circuit comprises a low pass circuit.

5. The high-frequency module according to claim 1, further comprising:
a phase shifter that is disposed between the first filter and the low noise amplifier.

6. The high-frequency module according to claim 1, further comprising:
a second filter having a third frequency band as a pass band and a fourth frequency band as an attenuation band; and
a switch that is disposed between the first filter and the second filter on a first side and the low noise amplifier on a second side, the switch being configured to selectively connect the low noise amplifier to the first filter or the second filter, wherein:
the first frequency band is at a high frequency side of the second frequency band and the third frequency band is at a high frequency side of the fourth frequency band,
the impedance matching circuit is connected between the switch and the low noise amplifier,
no circuit that performs impedance matching between the first filter and the low noise amplifier is disposed between the first filter and the switch, and no circuit that performs impedance matching between the second filter and the low noise amplifier is disposed between the second filter and the switch,
as seen in a Smith chart, due to the impedance matching circuit, the interval between the first impedance and the center point of the second gain circle is greater than the interval between the second impedance and the center point of the first gain,
as seen in the Smith chart, due to the impedance matching circuit, an interval between a third impedance and a center point of a fourth gain circle is greater than an interval between a fourth impedance and a center point of a third gain circle,
the third impedance is in the fourth frequency band when the second filter is viewed from an output end of the second filter,
the center point of the fourth gain circle indicates an impedance at which gain in the fourth frequency band of the low noise amplifier at the output end is maximized, the fourth impedance is in the third frequency band when the second filter is viewed from the output end of the second filter, and the center point of the third gain circle indicates an impedance at which gain in the third frequency band of the low noise amplifier at the output end is maximized.

7. The high-frequency module according to claim 1, further comprising:
a second filter having a third frequency band as a pass band and a fourth frequency band as an attenuation band; and
a switch that is disposed between the first filter and the second filter on a first side and the low noise amplifier on a second side, the switch being configured to selectively connect the low noise amplifier to the first filter or the second filter, wherein:
the first frequency band is at a low frequency side of the second frequency band and the third frequency band is at a low frequency side of the fourth frequency band,
the impedance matching circuit is connected between the switch and the low noise amplifier,
no circuit that performs impedance matching between the first filter and the low noise amplifier is disposed between the first filter and the switch, and no circuit that performs impedance matching between the second filter and the low noise amplifier is disposed between the second filter and the switch,
as seen in a Smith chart, due to the impedance matching circuit, the interval between the first impedance and the center point of the second gain circle is greater than the interval between the second impedance and the center point of the first gain,
as seen in the Smith chart, due to the impedance matching circuit, an interval between a third impedance and a center point of a fourth gain circle is greater than an interval between a fourth impedance and a center point of a third gain circle,
the third impedance is in the fourth frequency band when the second filter is viewed from an output end of the second filter,
the center point of the fourth gain circle indicates an impedance at which gain in the fourth frequency band of the low noise amplifier at the output end is maximized,
the fourth impedance is in the third frequency band when the second filter is viewed from the output end of the second filter, and
the center point of the third gain circle indicates an impedance at which gain in the third frequency band of the low noise amplifier at the output end is maximized.

8. The high-frequency module according to claim 1, further comprising:
a second filter having a third frequency band as a pass band and a fourth frequency band as an attenuation band; and
a switch that is disposed between the first filter and the second filter on a first side and the low noise amplifier on a second side, the switch being configured to selectively connect the low noise amplifier to the first filter or the second filter, wherein:
the first frequency band is at a high frequency side of the second frequency band and the third frequency band is at a low frequency side of the fourth frequency band,
the impedance matching circuit includes a first impedance matching circuit disposed between the first filter and the switch or a second impedance matching circuit disposed between the second filter and the switch, as seen in a Smith chart, due to the impedance matching circuit, the interval between the first impedance and the center point of the second gain circle is greater than the interval between the second impedance and the center point of the first gain, as seen in the Smith chart, due to the impedance matching circuit, an interval between a third impedance and a center point of a fourth gain circle is greater than an interval between a fourth impedance and a center point of a third gain circle, the third impedance is in the fourth frequency band when the second filter is viewed from an output end of the second filter, the center point of the fourth gain circle indicates an impedance at which gain in the fourth frequency band of the low noise amplifier at the output end is maximized, the fourth impedance is in the third frequency band when the second filter is viewed from the output end of the second filter, and the center point of the third gain circle indicates an impedance at which gain in the third frequency band of the low noise amplifier at the output end is maximized.

9. The high-frequency module according to claim 1, further comprising:

a second filter having a third frequency band as a pass band and a fourth frequency band as an attenuation band; and a switch that is disposed between the first filter and the second filter on a first side and the low noise amplifier on a second side, the switch being configured to selectively connect the low noise amplifier to the first filter or the second filter, wherein:

the first frequency band is at a low frequency side of the second frequency band and the third frequency band is at a high frequency side of the fourth frequency band, the impedance matching circuit includes at a first impedance matching circuit disposed between the first filter and the switch or a second impedance matching circuit disposed between the second filter and the switch, as seen in a Smith chart, due to the impedance matching circuit, the interval between the first impedance and the center point of the second gain circle is greater than the interval between the second impedance and the center point of the first gain, as seen in the Smith chart, due to the impedance matching circuit, an interval between a third impedance and a center point of a fourth gain circle is greater than an interval between a fourth impedance and a center point of a third gain circle, the third impedance is in the fourth frequency band when the second filter is viewed from an output end of the second filter, the center point of the fourth gain circle indicates an impedance at which gain in the fourth frequency band of the low noise amplifier at the output end is maximized, the fourth impedance is in the third frequency band when the second filter is viewed from the output end of the second filter, and the center point of the third gain circle indicates an impedance at which gain in the third frequency band of the low noise amplifier at the output end is maximized.

10. A transmission-reception module comprising:

the high-frequency module according to claim 1, the high-frequency module having a common terminal;

a third filter that is connected to the first filter via the common terminal, the third filter having the second frequency band as a pass band and the first frequency band as an attenuation band; and a power amplifier configured to supply an amplified high-frequency signal to the third filter.

11. A communication apparatus comprising:

the high-frequency module according to claim 1; and a radio frequency signal processing circuit configured to process a high-frequency signal supplied from the high-frequency module.

* * * * *